(12) United States Patent
Kurita et al.

(10) Patent No.: US 11,419,209 B2
(45) Date of Patent: Aug. 16, 2022

(54) RESIN MEMBER AND METHOD FOR PRODUCING RESIN MEMBER

(71) Applicant: DENSO CORPORATION, Kariya (JP)

(72) Inventors: Akihumi Kurita, Kariya (JP); Masato Ichikawa, Kariya (JP); Tsuyoshi Arai, Kariya (JP); Takeshi Kusano, Kariya (JP); Masashi Mori, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 17/153,400

(22) Filed: Jan. 20, 2021

(65) Prior Publication Data

US 2021/0144852 A1   May 13, 2021

Related U.S. Application Data

(63) Continuation of application No. PCT/JP2019/028191, filed on Jul. 18, 2019.

(30) Foreign Application Priority Data

Jul. 20, 2018 (JP) .............................. JP2018-136647
Jul. 10, 2019 (JP) .............................. JP2019-128420

(51) Int. Cl.
| | | |
|---|---|---|
| *H05K 1/03* | (2006.01) | |
| *B29C 70/54* | (2006.01) | |
| *C08K 3/04* | (2006.01) | |
| *C08K 7/14* | (2006.01) | |
| *H05K 3/10* | (2006.01) | |
| *B29C 70/14* | (2006.01) | |
| *B29C 70/88* | (2006.01) | |
| *H01B 1/24* | (2006.01) | |
| *B29K 309/08* | (2006.01) | |
| *B29L 31/34* | (2006.01) | |

(52) U.S. Cl.
CPC ........... *H05K 1/0373* (2013.01); *B29C 70/54* (2013.01); *C08K 3/04* (2013.01); *C08K 7/14* (2013.01); *H05K 3/10* (2013.01); *B29K 2309/08* (2013.01); *B29L 2031/3425* (2013.01); *C08K 2201/001* (2013.01)

(58) Field of Classification Search
None
See application file for complete search history.

(56) References Cited

U.S. PATENT DOCUMENTS

2014/0170393 A1    6/2014  Miyamoto et al.
2016/0230025 A1*   8/2016  Cappelli ............... H05K 1/095

FOREIGN PATENT DOCUMENTS

JP      S61182297 A    8/1986
JP      H10284306 A   10/1998
(Continued)

*Primary Examiner* — Ramsey Zacharia
(74) *Attorney, Agent, or Firm* — Harness, Dickey & Pierce, P.L.C.

(57) ABSTRACT

A resin member is formed from a resin material containing filler and an insulating base polymer as a main component. The resin member includes an alignment layer close to a surface of the resin member. The alignment layer includes the filler aligned in the surface direction and the base polymer filling the space between pieces of the filler. The alignment layer includes a carbonized portion that is carbonized matter of the base polymer, contains graphite, and provides electrical conductivity and thermal conductivity.

16 Claims, 56 Drawing Sheets

(56) References Cited

FOREIGN PATENT DOCUMENTS

| | | | |
|---|---|---|---|
| JP | 2000216521 | A | 8/2000 |
| JP | 2006287016 | A | 10/2006 |
| JP | 2008024571 | A | 2/2008 |
| JP | 2012164447 | A | 8/2012 |
| JP | 2012223795 | A | 11/2012 |

\* cited by examiner

RESIN MEMBER AND METHOD FOR PRODUCING RESIN MEMBER

CROSS-REFERENCE TO RELATED APPLICATION

The present application is a continuation application of International Application No. PCT/JP2019/028191 filed on Jul. 18, 2019, which is based on and claims the benefit of priority from Japanese Patent Application No. 2018-136647 filed on Jul. 20, 2018 and Japanese Patent Application No. 2019-128420 filed on Jul. 10, 2019. The contents of these applications are incorporated herein by reference in their entirety.

BACKGROUND

The present disclosure relates to a resin member and a method for producing the resin member.

Techniques for graphitizing the surface layer of a resin member to form carbonized matter are conventionally known.

SUMMARY

A resin member according to the first aspect of the present disclosure is formed from a resin material containing filler and an insulating base polymer as a main component. The resin member includes an alignment layer close to the surface of the resin member, and the alignment layer includes filler aligned in the surface direction. The alignment layer includes a carbonized portion that contains graphite.

A method for producing a resin member according to a first aspect of the present disclosure includes a molding step and a carbonization step. In the molding step, the resin material is molten, and molten resin corresponding to an area close to the surface of the resin member is subjected to shear stress and then solidified to form, close to the surface, the alignment layer including the pieces of filler aligned in the surface direction. In the carbonization step, the alignment layer is heat-treated, generating the carbonized portion including graphite.

A resin member according to the second aspect of the present disclosure includes a resin material and has a base portion and a carbonized portion. The base portion includes an insulating base polymer formed from a resin material and a filler stronger than the base polymer. The carbonized portion is provided in the outer surface of the base portion. The filler prevents the carbonized portion from being detached from the base portion.

A method for producing a resin member according to the second aspect of the present disclosure is a method for producing a resin member, and includes a preparation step and a carbonization step. The preparation step includes preparing a base portion including an insulating base polymer and filler stronger than the base polymer. The carbonization step includes heating the base portion to provide the outer surface of the base portion with a carbonized portion.

BRIEF DESCRIPTION OF THE DRAWINGS

The above and other objects, features, and advantages of the present disclosure will be clearly apparent from the detailed description provided below with reference to the accompanying drawings, in which.

DETAILED DESCRIPTION OF THE PREFERRED EMBODIMENTS

Figure 1:
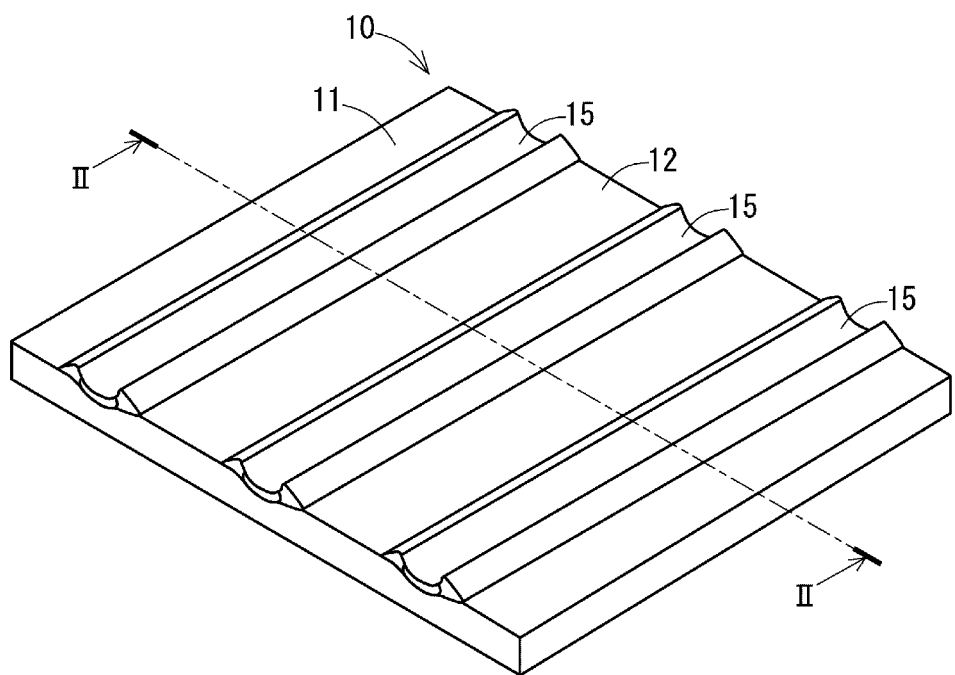
FIG. 1 is a perspective view of a resin member according to a first embodiment.

First, conventional forms and their problems will be described. Resin molded articles with localized conductivity are conventionally well known that are produced by covering an electrically conductive member with insulating resin during molding. According to JP 2012-164447 A, for example, at least two or more primary assemblies each including a plurality of metal circuit parts installed on a primary molded article are covered with insulating resin during secondary molding to produce a circuit component. However, this method involves a press step for forming the plurality of metal circuit parts of complex shapes, molds for the step, and an installation step for fitting the metal circuit parts to the primary molded article. For this reason, the process is complicated to increase the manufacturing costs. Furthermore, with a mold having an extremely fine shape compared with the thickness of a material, in the press step, the deforming stress applied to the mold when the material is pressed to form the above metal circuit parts will surpass the mold strength and rigidity. Thus, it is challenging to form a complex wiring pattern with a narrow and fine trace-to-trace pitch.

A method of forming a complex wiring pattern is disclosed in JP 2006-287016 A. The method is well known to plate the surface of a structure made from insulating resin to form a fine wiring pattern without using metal circuit parts produced in a press step. However, the plating step is a complex step that includes plating a structure made from resin, applying a resist, and forming a wiring pattern with a photomask. In addition, the plating step involves a liquid waste treatment step, increasing the manufacturing costs.

As a way of avoiding the above-mentioned increases in costs, JP 2000-216521 A discloses a method of partially graphitizing a resin member by laser irradiation to form an electrical conductor. Specifically, in JP 2000-216521 A, a resin member is irradiated with a beam to selectively graphitize a particular area in a resin surface layer, and the resultant carbonized matter is used as a part of the circuit pattern of a wiring board. However, a sudden increase in temperature produces gas rapidly due to decomposition, causing carbonized matter to be porous and scatter. In some cases, the generated graphite is irregularly aligned. Thus, it is challenging to enhance the electrical conductivity and the thermal conductivity.

As a way of enhancing the electrical conductivity and the thermal conductivity, JP 2012-223795 A discloses a method of forming a good electrically conductive pattern at any site by firing an overall woody material in an oxygen-free atmosphere at relatively low temperatures from 400° C. to 600° C. for 30 minutes to produce carbonized matter having some insulating properties, and then irradiating the woody material with a laser beam in the fiber direction. However, the overall carbonization as pretreatment reduces the strength and the insulating properties of a base member compared with the physical properties of the yet-to-be carbonized material. Additionally, preheating takes time and raises the manufacturing costs. Thus, an equivalent or higher electrical conductivity is to be provided in a localized manner within a short time without the overall carbonization step. Furthermore, in place of the woody material, equivalent or higher electrical conductivity is to be imparted to a resin member formed from a strong and heat-resistant engineering plastic material.

As a way of providing graphite with good electrical conductivity and thermal conductivity, JP 2008-24571 A discloses a method of producing a graphite film with good electrical conductivity and thermal conductivity by preparing, as a starting material, a high polymer film material that is a thin resin member formed by applying solvent to a substrate before drying or stretching, and then carbonizing the material. However, if the method is used for a thick and rigid resin member, gas due to decomposition in the generation process does not readily be emitted, which is likely to cause carbonized matter to scatter. Additionally, it is difficult to align the a-b plane of graphite in the surface direction, and predetermined electrical conductivity and thermal conductivity are not easily achieved. Furthermore, overall heat treatment is used in this technique, and thus a localized treatment method is needed to provide electrical conductivity and thermal conductivity in a localized manner.

Among these techniques, the present disclosures suppose that it is useful to enhance the electrical conductivity of the carbonized matter provided on the surface of a resin member. However, JP 2000-216521 A does not disclose enhancement of the electrical conductivity of the carbonized matter, and there is room for improvement.

The present disclosure has been made in view of the above, and an object of the disclosure is to provide a resin member having higher-conductivity carbonized matter on its surface, and a method for producing the resin member.

For carbonized matter close to the surface of a resin member, it is useful to enhance the electrical conductivity in a direction parallel to the surface (hereinafter, the surface direction). However, JP 2000-216521 A does not disclose the electrical conductivity of carbonized matter in a specific direction, and there is room for improvement. An object of a first aspect of the present disclosure is to enhance the electrical conductivity of carbonized matter formed close to the surface of a resin member and in particular, enhance the electrical conductivity in the surface direction.

A resin member according to the first aspect of the present disclosure is formed from a resin material containing filler and an insulating base polymer as a main component. The resin member includes an alignment layer close to the surface of the resin member, and the alignment layer includes filler aligned in the surface direction and a base polymer filling the space between pieces of the filler. The alignment layer includes a carbonized portion that is carbonized matter of the base polymer, contains graphite, and provides electrical conductivity and thermal conductivity.

A method for producing a resin member according to a first aspect of the present disclosure includes a molding step and a carbonization step. In the molding step, the resin material is molten, and molten resin corresponding to an area close to the surface of the resin member is subjected to shear stress and then solidified to form, close to the surface, the alignment layer including the pieces of filler aligned in the surface direction and the base polymer filling the space between the pieces of filler. In the carbonization step, the alignment layer is heat-treated in a localized manner to carbonize the base polymer included in the alignment layer, generating the carbonized portion including graphite and providing electrical conductivity and thermal conductivity.

According to the first aspect of the present disclosure, the alignment of the pieces of filler in the surface direction in the alignment layer facilitates the formation of a layered structure in which the carbonized matter generated during the carbonization of the base polymer filling the space between the pieces is aligned in the surface direction. Furthermore, the a-b plane of the graphite included in the carbonized matter is easily aligned in the surface direction. This enhances the electrical conductivity of the carbonized matter in the surface direction.

When the alignment layer is heat-treated for carbonization in a localized manner, the filler contained in the alignment layer prevents the heated site from overheating and slows down the rate of increase in temperature to control sudden generation of gas due to decomposition that scatters carbonized matter. The filler also anchors the carbonized matter or the macromolecules of the base polymer to prevent scattering of the carbonized matter caused by gas generated due to decomposition. This enhances the fixation of the carbonized matter, improving the electrical conductivity.

For the carbonized portion including carbonized matter on the surface of the resin member, the carbonized matter may be detached during or after the production of the resin member to reduce the electrical conductivity of the carbonized portion (i.e., increase the resistance value of the carbonized portion). An object of a second aspect of the present disclosure is to prevent the electric conductivity of the carbonized portion from decreasing.

A resin member according to the second aspect of the present disclosure includes a resin material and has a base portion and a carbonized portion. The base portion includes an insulating base polymer formed from a resin material and a filler stronger than the base polymer, and is reinforced by the filler mixed in the base polymer. The carbonized portion is provided in the outer surface of the base portion and has electrical conductivity due to carbonized substances included therein. The filler prevents the carbonized portion from being detached from the base portion, with at least pieces of the filler penetrating the carbonized portion.

A method for producing a resin member according to the second aspect of the present disclosure is a method for producing a resin member including a resin material, and includes a preparation step and a carbonization step. The preparation step includes preparing a base portion including an insulating base polymer formed from the resin material and filler stronger than the base polymer, and reinforced by the filler mixed in the base polymer. The carbonization step includes heating the base portion to provide the outer surface of the base portion with a carbonized portion having electrical conductivity due to included carbonized substances obtained by carbonizing a part of the base polymer such that at least pieces of the filler penetrate the carbonized portion to prevent the carbonized portion from being detach from the base portion.

According to the second aspect of the present disclosure, the filler prevents the carbonized substances from being lost after the resin member is produced. This prevents the carbonized portion from decreasing in electrical conductivity due to removal of the carbonized substances. Furthermore, while the base polymer is being carbonized by heating to generate the carbonized portion, the filler controls scattering of the carbonized portion caused by generation of gas due to decomposition. This prevents decrease in the electrical conductivity of the carbonized portion and division of the carbonized portion caused by scattering of a part of the carbonized portion with heating.

Embodiments of resin members that solve the problems with the conventional forms will now be described with reference to the drawings. In the embodiments, substantially the same components are given the same reference numerals, and will not be described redundantly.

First Embodiment

Figure 2:
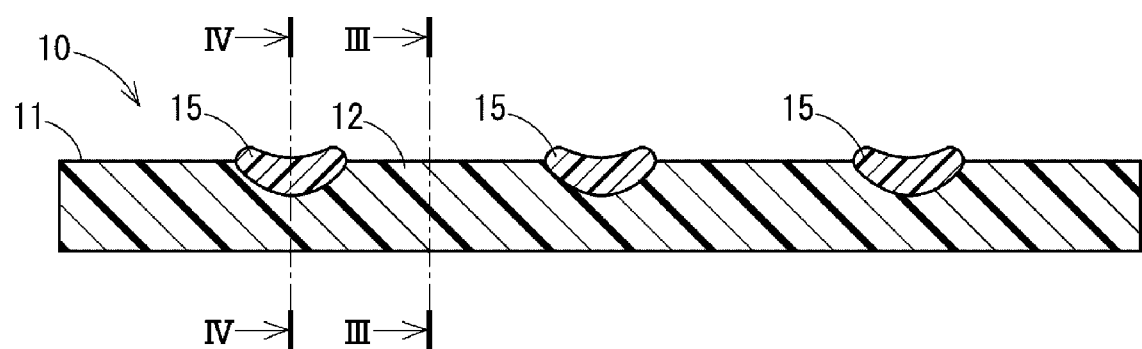
FIG. 2 is a cross-sectional view taken along line II-II in FIG. 1.
Figure 3:
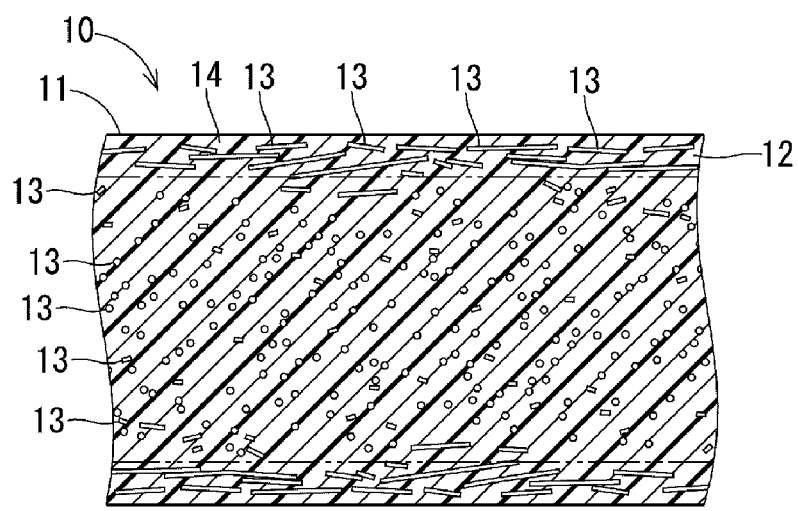
FIG. 3 is a cross-sectional view taken along line III-III in FIG. 2.

A resin member according to a first embodiment is illustrated in FIGS. 1 and 2. A resin member 10 is formed from a resin material containing filler and an insulating base polymer as a main component. As shown in FIG. 3, the resin member 10 includes an alignment layer 12 close to a surface 11 of the resin member 10. The alignment layer 12 includes many pieces of filler 13 aligned in a direction parallel to the surface 11 (hereinafter, the surface direction), and a base polymer 14 filling the space between the pieces of filler 13.

Figure 4:
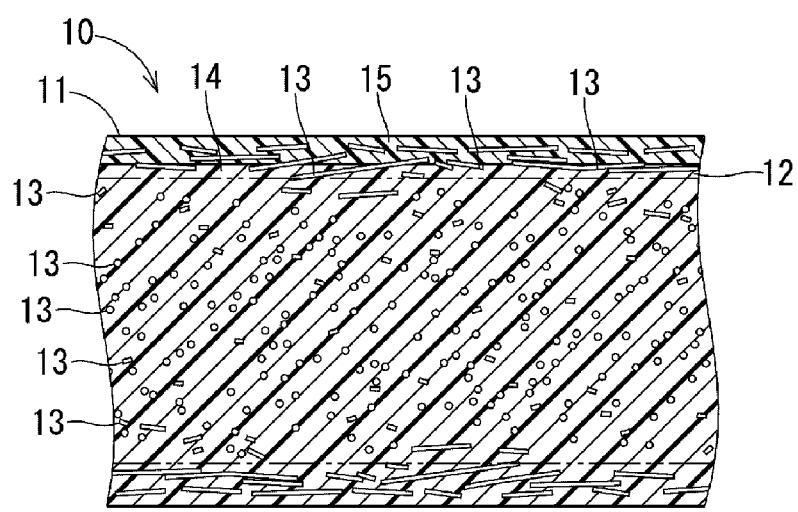
FIG. 4 is a cross-sectional view taken along line IV-IV in FIG. 2.
Figure 8:
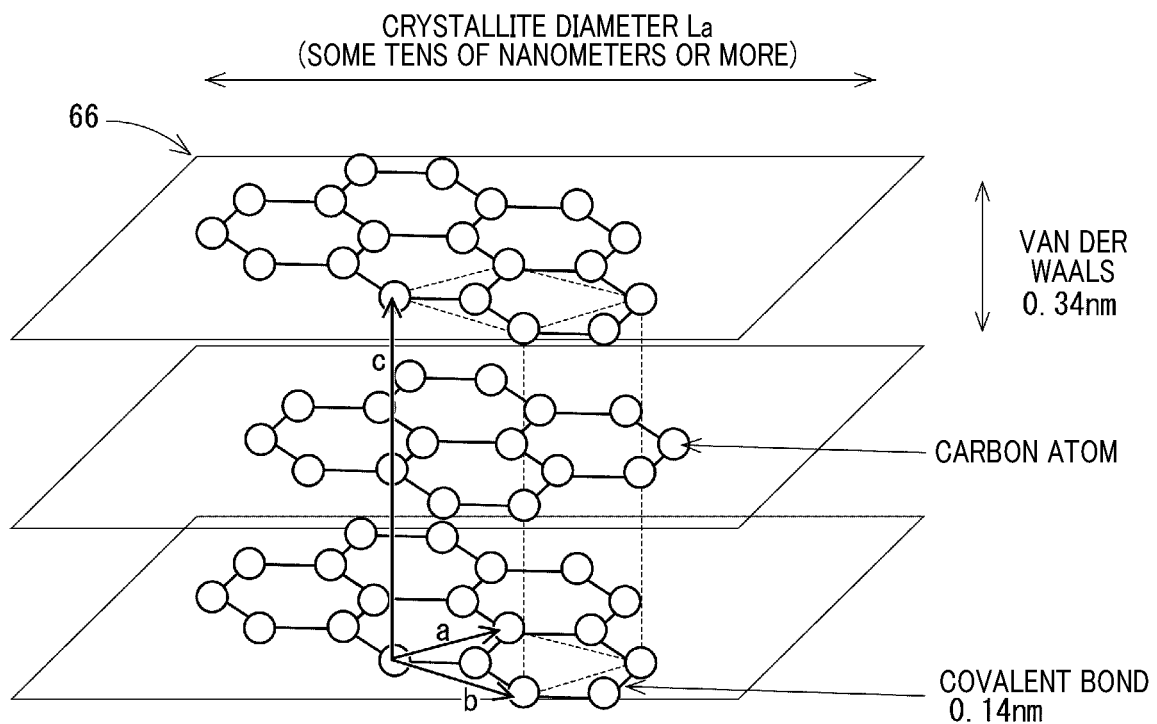
FIG. 8 is a diagram illustrating the a-b plane of graphite forming a carbonized portion in FIG. 4.

As shown in FIG. 4, the alignment layer 12 includes a carbonized portion 15 that is carbonized matter of the base polymer 14, contains graphite, and provides electrical conductivity and thermal conductivity. In the graphite composed of carbon atoms bound to each other as shown in FIG. 8, one of the four outer shell electrons belonging to each carbon atom remains redundant and free to move, so that the carbonized portion 15 is electrically conductive.

The resin member 10 has a thickness of 300 μm or more at a site of the carbonized portion 15 formed. In the first embodiment, as shown in FIG. 1, the carbonized portion 15 is formed as multiple straight lines into an electrically conductive pattern. The electrically conductive pattern is, for example, used as circuit wiring in an electronic device such as an air flow meter or a rotation angle sensor. For the carbonized portion 15 used in this manner as circuit wiring for carrying electrical signals, the generated carbonized matter has a volume resistivity of at least $1.0 \times 10^{-3}$ Ωm or less, preferably $1.0 \times 10^{-4}$ Ωm or less, and more preferably $1.0 \times 10^{-5}$ Ωm or less. The carbonized portion 15 may have another shape of pattern such as a grid. The carbonized portion 15 may not be a pattern, but may be formed as a film. The carbonized portion 15 is not limited to circuit wiring, but may also be used as, for example, electromagnetic shielding, a static elimination circuit, an antistatic member, or a heat sink.

Figure 5:
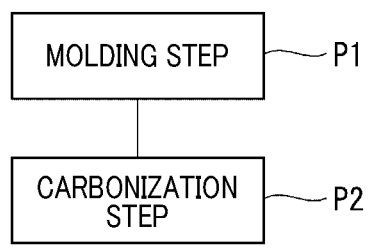
FIG. 5 is a process diagram of a production method according to the first embodiment.

A method for producing the resin member 10 will now be described. As shown in FIG. 5, the method for producing the resin member 10 includes molding step P1 and carbonization step P2.

<Molding Step (Primary Molding Step)>

Figure 6:
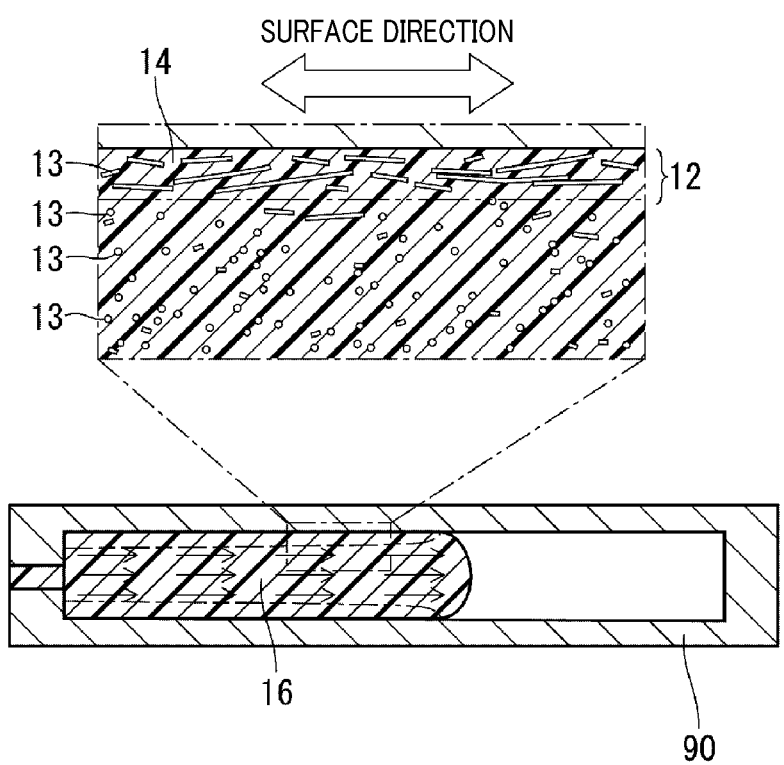
FIG. 6 is a cross-sectional view of a mold into which molten resin is being injected in a molding step of the production method according to the first embodiment, illustrating the alignment state of filler near the interface between the mold and the molten resin.

In molding step P1, as shown in FIG. 6, a resin material including the filler 13 and the insulating base polymer 14 is molten at a predetermined plasticizing temperature into molten resin 16, which is then injected at high speed into a mold 90 with a predetermined shape, and cooled and solidified under pressure. In this process, shear stress is applied between the surface of the mold 90 and the surface of the molten resin 16, or during charging, shear stress is applied between the resin material adhering to the mold surface when the heat is released from the mold 90, and molten resin 16 with fluidity remains in its central area in the thickness direction. As a result, the pieces of filler 13 are aligned preferentially in the surface direction rather than the direction normal to the surface, and the base polymer 14 also extends between the pieces to form the horizontally charged alignment layer 12 close to the surface of a molded article 17.

The filler 13 slows the rate of increase in temperature during the formation of the carbonized portion 15 (see FIG. 4) and also produces an anchor effect on the carbonized matter to prevent carbonized matter from scattering during carbonization at high temperatures. This enables a fine electrically conductive pattern to be formed with accuracy even at temperatures at which carbonized matter in a filler-free natural resin member would scatter violently and a fine electrically conductive pattern would be difficult to form.

The pieces of filler 13 are desirably aligned in the surface direction in order not to interfere with the electrical connection between carbonized substances on the electrically conductive pattern.

The electrical conductivity of the electrically conductive pattern generated by laser irradiation is much better in a resin member containing about 40 wt % glass fiber as the filler 13 than in a resin member containing no filler 13. The electrical conductivity of the electrically conductive pattern generated by laser irradiation is better in a resin member containing about 40 wt % glass fiber as the filler 13 than in a resin member containing about 15 wt % glass fiber. Furthermore, the electrical conductivity of the electrically conductive pattern is much better in a laser carbonized area in which the pieces of filler 13 are aligned than in a laser carbonized area in which no filler 13 is aligned.

Although the molded article 17 may be produced by, for example, injection molding, transfer molding, extrusion molding, or compression molding, injection molding is desirable because greater shearing force can be applied to facilitate the formation of the alignment layer 12 in which the pieces of filler 13 are arranged more strongly.

Figure 7:
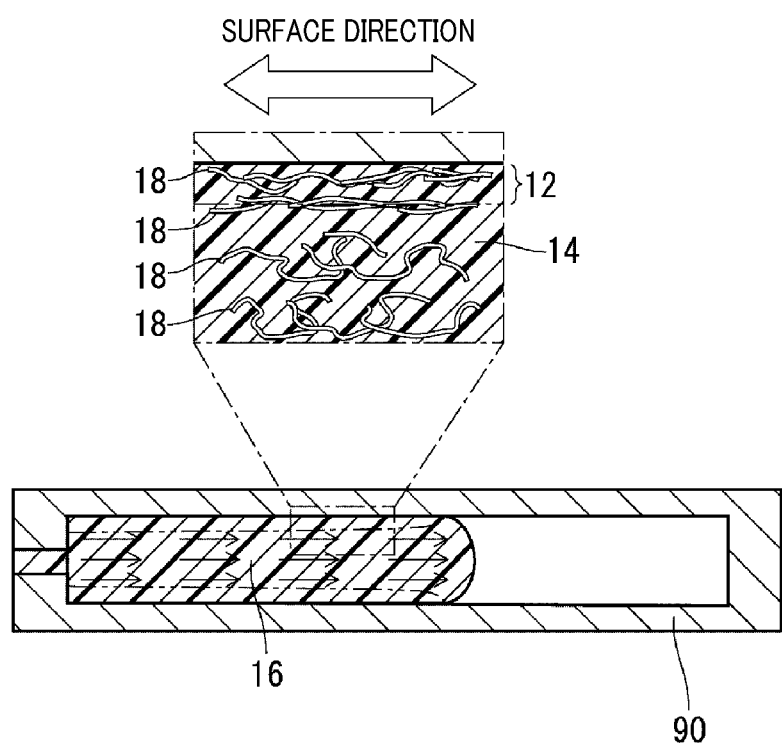
FIG. 7 is a cross-sectional view of the mold in FIG. 6, illustrating the alignment state of molecular chains near the interface between the mold and the molten resin.

As shown in FIGS. 6 and 7, the alignment layer 12 contains the pieces of filler 13 and molecular chains 18 aligned in the surface direction and the base polymer 14 charged in a manner to extend between the pieces of filler 13 in the surface direction. Thus, the carbonized matter generated during carbonization tends to form a layered structure aligned and elongated in the surface direction, enhancing the electrical conductivity and the thermal conductivity in the surface direction. The shear stress is also applied in the surface direction to the macromolecules forming the base polymer 14, and thus with the molecular chains 18 aligned, the a-b plane of the graphite (see FIG. 8) constituting the carbonized matter is easily aligned in the surface direction. This enhances the electrical conductivity and the thermal conductivity in the surface direction. The above effect is particularly expected when a thermoplastic resin mainly composed of a chain polymer is to be selected as the base polymer 14.

In the production of the molded article 17, it is appropriate that, in an area to be carbonized, the shearing force during molding be applied to the surface as much as possible to align the pieces of filler 13 and the molecular chains 18. It is thus desirable that an area to be carbonized avoid being provided with a weld line or a final filling portion, and the gate be positioned, shaped, and conditioned so as to avoid the occurrence of jetting. To increase the degree of alignment of the pieces of filler 13 and the molecular chains 18 in the molding process, the mold surface may, for example, move to raise the shear stress, or more specifically, slide or rotate. As long as the alignment layer 12 is close to the surface of the molded article 17, the molded article 17 may be produced by a method other than a method using an injection molding machine.

Since the base polymer 14 forming the resin material is carbonized in carbonization step P2, which is the subsequent step, into a graphitic structure, the base polymer 14 desirably has a high carbon content and a carbocyclic structure similar to the a-b plane of graphite. Examples of the base polymer 14 include aromatic condensation polymer materials that are at least one or more polymers selected from the group consisting of polyacrylonitrile, polyacrylic styrene, polyarylates, polyamides, polyamide-imides, polyimides, polyether ether ketone, polyether ketone, polyetherimides, polyether nitrile, polyethersulfone, polyoxybenzylmethylenglycolanhydride, polyoxybenzoyl polyester, polysulfone, polycarbonate, polystyrene, polyphenylene sulfide, polyparaxylene, polyethylene terephthalate, polybutylene terephthalate, polyethylene naphthalate, polyphenylene ether, liquid crystal polymers, bisphenol A copolymers, and bisphenol F copolymers. Aromatic polymers are desirable because they contain, in the main chain, a 6-membered carbon ring (i.e., a benzene ring), which forms the basic structure of graphite. However, other materials may also be used. Furthermore, for the purpose of localized carbonization, self-extinguishing materials are more desirable so as not to cause overburning during carbonization.

In order to deal with gas due to decomposition suddenly generated when the heat treatment in carbonization step P2, which is the subsequent step, causes a sudden temperature increase and carbonization, the filler 13 is expected to lower the temperature at a laser beam irradiation spot to slow down the rate of increase in temperature, and to serve as an anchor to prevent scattering of the carbonized matter caused by generated gas due to decomposition. The filler 13 thus desirably has strength and heat resistance, and a shape with a high aspect ratio. That is, the filler 13 is desirably a fibrous substance less flammable than the base polymer 14, such as an inorganic fibrous substance. More specifically, glass fiber is desirable because of the above properties as well as inexpensiveness. When glass fiber is used, the heat treatment will melt and solidify the glass to enhance the fixation of the carbonized matter. Furthermore, for the purpose of localized carbonization, the filler 13 may contain an incombustible material that provides self-extinguishing properties so as not to cause overburning during carbonization.

The glass fiber is desirably added in an amount that maximizes the electrical conductivity and the thermal conductivity. In the case of too little glass fiber being added, the fixation of the carbonized matter due to the anchor effect is insufficient, and heating carbonization produces gas due to decomposition suddenly and promotes scattering of the carbonized matter, reducing the electrical conductivity and the thermal conductivity. In the case of too much glass fiber being added, the amount of the polymer material relatively decreases, and the density of the carbonized matter lowers, reducing the electrical conductivity and the thermal conductivity. Thus, when the base polymer 14 used is a polymer with a density of about 1.3 to 1.4 $g/cm^2$ in its natural state, such as polyphenylene sulfide, polybutylene terephthalate, polyether ether ketone, or polyoxybenzylmethylenglycolanhydride, the weight proportion of the glass fiber to the entirety, or the weight proportion of the filler 13 to the entire resin member 10 is desirably 30 wt % to 66 wt %, preferably 30 wt % to 45 wt %, and more preferably 40 wt %.

Examples of materials for the filler 13 other than glass fiber include inorganic fibrous substances such as aramid fiber, asbestos fiber, gypsum fiber, carbon fiber, silica fiber, silica-alumina fiber, alumina fiber, zirconia fiber, silicon nitride fiber, silicon fiber, potassium titanate fiber, and metal fibrous substances including stainless steel, aluminum, titanium, copper, and brass.

Examples of powdered filling materials include silica, quartz powder, glass beads, milled glass fiber, glass balloons, glass powder, calcium silicate, aluminum silicate, kaolin, talc, clay, diatomite, silicates such as wollastonite, metal oxides such as iron oxide, titanium oxide, zinc oxide, antimony trioxide, and alumina, metal carbonates such as calcium carbonate and magnesium carbonate, metal sulfates such as calcium sulfate and barium sulfate, ferrite, silicon carbide, silicon nitride, boron nitride, and other various metal powders. Examples of materials for plate-like filling include mica, glass flakes, and various types of metallic foil. However, other materials capable of fixing the carbonized matter and forming an alignment layer may also be used.

Highly electrically conductive or thermally conductive filler 13 may be added to provide electrical conductivity or thermal conductivity to the molded article 17 yet to be carbonized. Also, in this case, carbonizing the base polymer 14 will enhance the electrical conductivity and the thermal conductivity.

<Carbonization Step>

Figure 9:
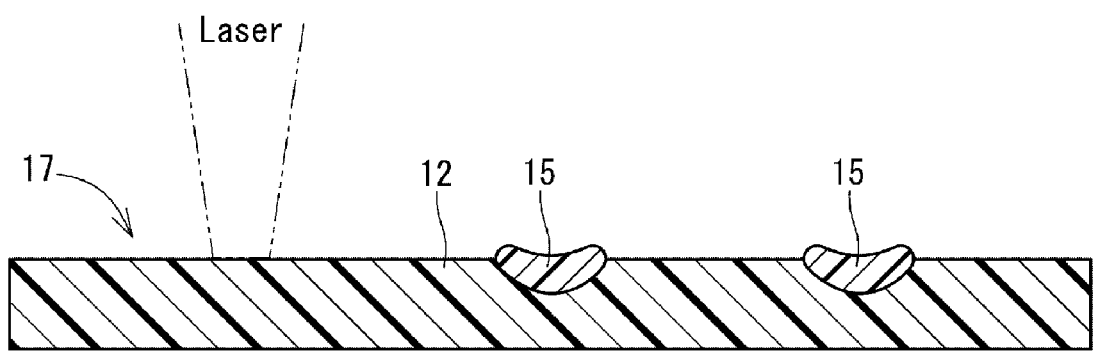
FIG. 9 is a cross-sectional view of a molded article with its alignment layer being irradiated with a laser beam in a carbonization step of the production method according to the first embodiment.

In carbonization step P2, as shown in FIG. 9, the alignment layer 12 close to the surface of the molded article 17 is carbonized by heating at 1000° C. or more using, for example, laser beam irradiation to cleave bonds in the polymer material and expel constitutive elements other than carbon as gas due to decomposition including carbon dioxide, carbon monoxide, nitrogen, and hydrogen. More desirably, the alignment layer 12 is heated at 2000° C. or more and partially transformed into graphite including 6-membered carbon rings bound in plane to generate the carbonized portion 15 including graphite in localized areas on the surface of the alignment layer 12. The carbonized portion 15 provides electrical conductivity or thermal conductivity. The carbonization atmosphere is desirably an inert gas in order to retain as many carbon components as possible. Examples of the inert gas include argon and helium.

Higher temperature heat treatment allows easier transformation into good graphite with good electrical conductivity or thermal conductivity. Thus, the heat treatment temperature is desirably 2000° C. or more to give carbonized matter with good electrical conductivity or thermal conductivity. Examples of localized heating methods include laser beam irradiation, plasma treatment, high pressure water vapor application, electron beam irradiation, and Joule heating. Laser beam irradiation is desirable because it is inexpensive and able to apply heat at temperatures higher than 2000° C. within a short time in a localized manner.

As disclosed in JP 2008-24571 A directed to a method of producing a graphite film, in a typical example, laser beam irradiation increases temperature faster than gradual heating in a furnace that takes a long time. When a resin is irradiated with a laser beam and heated to a high temperature suddenly, electrically conductive carbonized matter and gas due to decomposition are generated. The gas due to decomposition jets out. The resultant strong impact catches carbonized matter in the gas due to decomposition, and the carbonized matter is expelled from the substrate. In other words, sudden generation of gas due to decomposition scatters carbonized matter significantly. This causes a reduction in the electrical conductivity and the thermal conductivity of the carbonized portion 15. In particular, unlike a thin member such as a film, when a thick member with a thickness of at least 300 μm or more is carbonized, gas due to internal decomposition cannot easily flow out. The gas flowing out tends to scatter carbonized matter while breaking the structure. This is a serious cause of reduction in the electrical conductivity and the thermal conductivity.

In the present embodiment, to regulate the above, the filler 13 is contained in the resin material in a manner to account for a predetermined percentage. The filler 13 slows down the rate of increase in temperature and produces an anchor effect during carbonization. Laser irradiation increases temperature mainly because of the heat generation due to the absorption of a laser beam and the heat of combustion generated when the base polymer 14 carbonizes, and the latter has greater influence. When the filler 13 is contained in the resin material in a manner to account for a predetermined percentage, the base polymer 14 decreases relatively to reduce the heat of combustion and slow down the rate of increase in temperature. The filler 13 fixed in the substrate penetrates into or through the carbonized matter like a wedge, producing the anchor effect that prevents the carbonized matter from separating from the substrate. The filler 13 is fixed in a resin portion that is close to the carbonized portion 15 and not to be carbonized or in a resin portion that is positioned forward in the laser scanning direction on the laser beam path and yet to be irradiated with a laser beam, and during carbonization by laser irradiation, the fixed filler 13 will not allow removal of the carbonized matter caught in the filler 13. In this manner, the carbonized matter is prevented from scattering and coming off, and the fixation is enhanced.

Since the layer with the pieces of filler 13 aligned in the surface direction is formed before carbonization, the polymer filling the space between the pieces of filler 13 is carbonized into a layered structure extending in the surface direction. This enhances the electrical conductivity or the thermal conductivity. In the present embodiment, in molding step P1, the macromolecules forming the base polymer 14 are aligned in the surface direction by the application of shearing force while molten. As a result, the surface direction and the a-b plane of the graphite forming the carbonized matter tend to form a small angle. This enhances the electrical conductivity and the thermal conductivity in the surface direction.

As a laser beam irradiation method to form the finest possible pattern within a short time, the alignment layer 12 yet to be carbonized may be directly scanned only once with a laser beam having a high energy density (i.e., laser intensity). In some cases, two-stage scanning may be performed so as to control sudden generation of gas due to decomposition and scattering of carbonized matter as described above. For example, scanning may be performed with a laser beam having a relatively low energy density in a reduced pressure environment to produce a structure including carbon components as its main components, at a relatively low rate of increase in temperature. Then, a laser beam having a high energy density may be applied at a higher temperature to accelerate the carbonization. In other cases, irradiation may be divided into multiple stages as appropriate. After or during the formation of an electrically conductive pattern with a laser beam, a voltage may be applied to perform Joule heating in order to promote the carbonization.

As a laser beam path, simple scanning forms a linear pattern. The scanning evaporates a part of the polymer near the focus of the laser beam to form a groove. Other scanning methods include a method of scanning a certain surface without leaving space to form a dense carbonized film on a large area. Also, in this case, a laser beam evaporates a part of the polymer, forming a groove along the laser beam path as irregularities. In laser beam irradiation, the laser beam may be moved relative to the molded article 17, the molded article 17 may be moved with the laser beam fixed, or both may be moved.

The laser beam may be of any type as long as it heats a localized area at a high temperature, and examples of lasers include a $CO_2$ laser, a YAG laser, a $YVO_4$ laser, and a semiconductor laser (GaAs, GaAlAs, GaInAs). To form a fine pattern, a laser beam emitted from a short-wavelength laser such as a YAG laser is desirable. To carbonize a large or a deep area, a laser beam emitted from a long-wavelength laser such as $CO_2$ laser is desirable.

As described above, too high an energy density is not preferable as laser beam conditions because the spot will overheat and the temperature will increase too sharply, generating gas due to decomposition suddenly, scattering carbonized matter. However, too low an energy density is also not preferable because the increased temperature is insufficient to generate graphite. Note that this does not mean laser irradiation is moderated so as not to burn the filler 13. Immediately below the laser beam spot, the temperature is very high, and the filler 13 there is molten or cut. However, the temperature of an area slightly off the laser beam spot (e.g., the bottom surface and the side surface of a groove) is relatively low, and thus the filler 13 remains. When a typical semiconductor laser is used to start scanning at an approximately focal length, an output of 100 W and a scan rate of about 50 mm/s are desirable. During laser processing, too low an atmospheric pressure is unsuitable because the density of carbonized matter decreases. Too high an atmospheric pressure is also unsuitable because gas due to decomposition cannot easily flow out and may break the structure of carbonized matter. A pressure of 3 MPa or less is desirable.

As the laser intensity increases or the atmospheric pressure during laser processing rises, the volume resistivity of the carbonized portion 15 decreases. This is because an increase in temperature at the processed area promotes the change of the binding state of the base polymer 14 to the bonding state of graphitic carbon.

The volume resistivity is an indicator of electrical conductivity per unit volume. That is, in the carbonized portion 15 including carbonized matter and the filler 13, as the percentage of the electrically conductive carbonized matter per unit volume increases, the volume resistivity decreases. However, too little filler 13 would cause carbonized matter to be caught in gas due to decomposition and scattered in carbonization step P2. Thus, when the filler 13 is reduced within a range that allows the carbonized matter to be held on the substrate by the anchor effect, and the percentage of the carbonized matter is increased, the volume resistivity of the carbonized portion 15 decreases.

(Effects)

In the first embodiment, as described above, the resin member 10 includes, close to the surface 11, the alignment layer 12 including the pieces of filler 13 aligned in the surface direction and the base polymer 14 filling the space between the pieces of filler 13. The alignment layer 12 has the carbonized portion 15 that is carbonized matter of the base polymer 14, includes graphite, and provides electrical conductivity and thermal conductivity.

The alignment of the pieces of filler 13 in the surface direction in the alignment layer 12 facilitates the formation of a layered structure in which the carbonized matter generated during the carbonization of the base polymer 14 filling the space between the pieces is aligned in the surface direction. Furthermore, the a-b plane of the graphite included in the carbonized matter is easily aligned in the surface direction. This enhances the electrical conductivity of the carbonized matter in the surface direction.

When the alignment layer 12 is heat-treated for carbonization in a localized manner, the filler 13 contained in the alignment layer 12 prevents the heated site from overheating and slows down the rate of increase in temperature to control sudden generation of gas due to decomposition that scatters carbonized matter. The filler 13 also anchors the carbonized matter or the macromolecules of the base polymer 14 to prevent scattering of the carbonized matter caused by generated gas due to decomposition. This enhances the fixation of the carbonized matter, improving the electrical conductivity.

In the first embodiment, the resin member 10 has a thickness of 300 µm or more at a site of the carbonized portion 15 formed. Even when such a relatively thick member is carbonized, the filler 13 contained in the resin material in a manner to account for a predetermined percentage slows down the rate of increase in temperature as well as producing an anchor effect during carbonization, preventing the carbonized matter from scattering.

In the first embodiment, the weight proportion of the filler 13 to the resin member 10 is 40 wt %. This effectively slows the rate of increase in temperature and produces anchor effect during carbonization, enhancing the electrical conductivity of the carbonized portion 15.

In the first embodiment, the filler 13 is glass fiber. This effectively slows the rate of increase in temperature and produces anchor effect during carbonization, enhancing the electrical conductivity of the carbonized portion 15. This material is also inexpensive. In addition, the glass is molten and solidified by heat treatment, enhancing the fixation of the carbonized matter.

In the first embodiment, the method for producing the resin member 10 includes molding step P1 and carbonization step P2. In molding step P1, the resin material is molten, and molten resin corresponding to an area close to the surface 11 of the resin member 10 is subjected to shear stress and then solidified to form, close to the surface 11, the alignment layer 12 including the pieces of filler 13 aligned in the surface direction and the base polymer 14 filling the space between the pieces of filler 13. In carbonization step P2, the alignment layer 12 is heat-treated in a localized manner to carbonize the base polymer 14 included in the alignment layer 12, generating the carbonized portion 15 including graphite and providing electrical conductivity and thermal conductivity.

In this manner, the pieces of filler 13 are aligned in the surface direction in the alignment layer 12 in molding step P1, facilitating the formation of a layered structure in which the carbonized matter generated during the carbonization of the base polymer 14 filling the space between the pieces is aligned in the surface direction. Furthermore, the a-b plane of the graphite included in the carbonized matter is easily aligned in the surface direction. This enhances the electrical conductivity of the carbonized matter in the surface direction.

When the alignment layer 12 is heat-treated for carbonization in a localized manner in carbonization step P2, the filler 13 contained in the alignment layer 12 prevents the heated site from overheating and slows down the rate of increase in temperature to control sudden generation of gas due to decomposition that scatters carbonized matter. The filler 13 also anchors the carbonized matter or the macromolecules of the base polymer 14 to prevent generated gas due to decomposition from scattering the carbonized matter. This enhances the fixation of the carbonized matter, improving the electrical conductivity.

In carbonization step P2 in the first embodiment, the alignment layer 12 is heat-treated in a localized manner by laser beam irradiation. This heat treatment allows localized heat application at a high temperature greater than 2000° C. within a short time. This enables an electrically conductive pattern to be formed within a short time at low cost. The use of a laser beam allows the layout of an electrically conductive pattern to be changed by simply modifying the scanning software program without changing the hardware. This enables the layout of an electrically conductive pattern to be changed within a short time at low cost. For example, the use of pressed components would require steps of installing and removing molds.

In the first embodiment, the resin material is molded by injection molding in molding step P1. This enables relatively large shear stress to be applied to molten resin corresponding to an area close to the surface 11 of the resin member 10, facilitating the formation of the alignment layer 12 in which the pieces of filler 13 are arranged more strongly.

Second Embodiment

Figure 10:
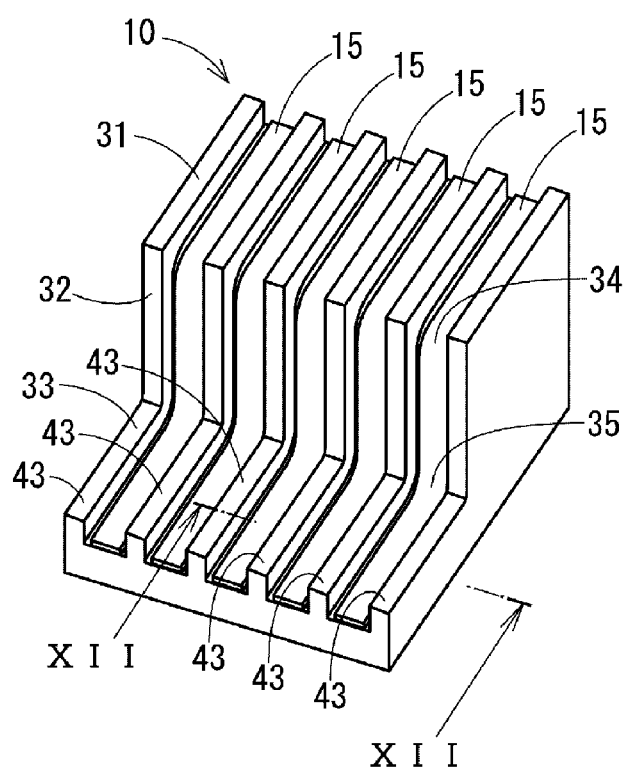
FIG. 10 is a perspective view of a resin member according to a second embodiment.
Figure 11:
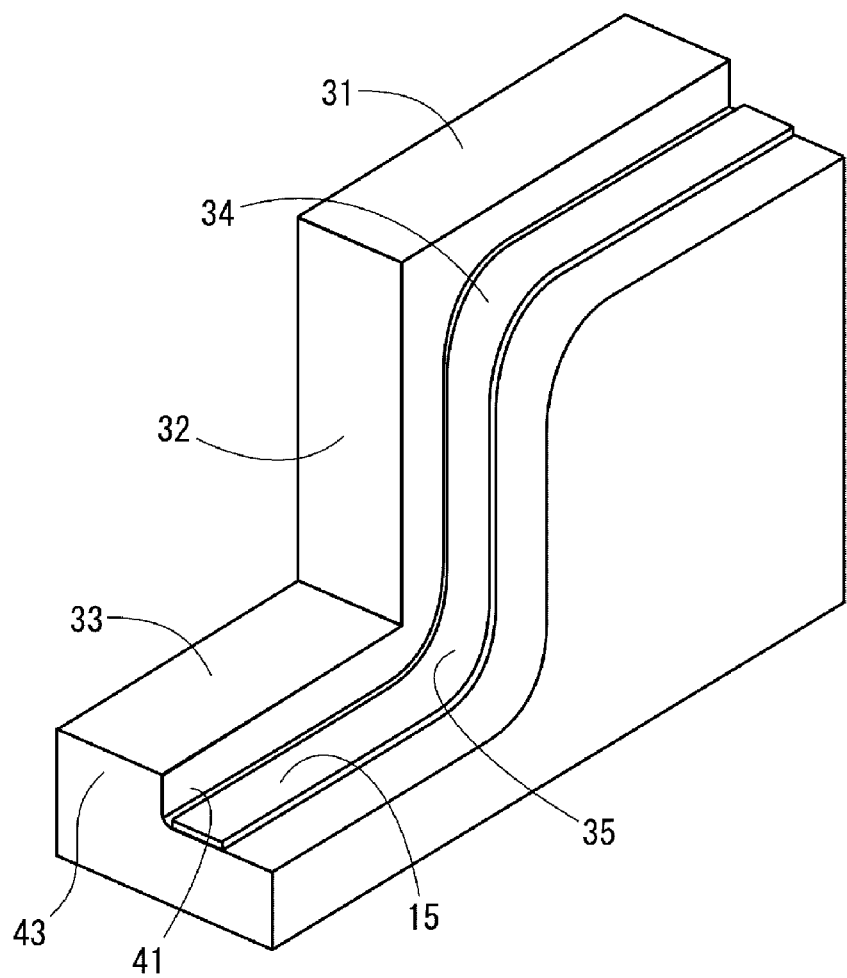
FIG. 11 is an enlarged perspective view of a part of a carbonized portion in FIG. 10.

In a second embodiment, as shown in FIGS. 10 and 11, a resin member 10 is not simply flat, but has steps including a first surface 31, a second surface 32, and a third surface 33 intersecting each other. Carbonized portions 15 are formed three-dimensionally from the first surface 31 to the second surface 32, and from the second surface 32 to the third surface 33. The molded article before carbonization is desirably shaped so that the molten resin in the areas to be carbonized flows in a manner to align the fillers and the molecular chains with shearing force applied as much as possible to the surface during molding. Thus, the first surface 31 and the second surface 32 form an outside corner 34 shaped as a relatively large R (i.e., rounded), and the second surface 32 and the third surface 33 form an inside corner 35 also shaped as a relatively large R. The outside corner 34 and the inside corner 35 desirably have the greatest possible radius of curvature. Specifically, at least 5 mm or more is desirable.

Figure 12:
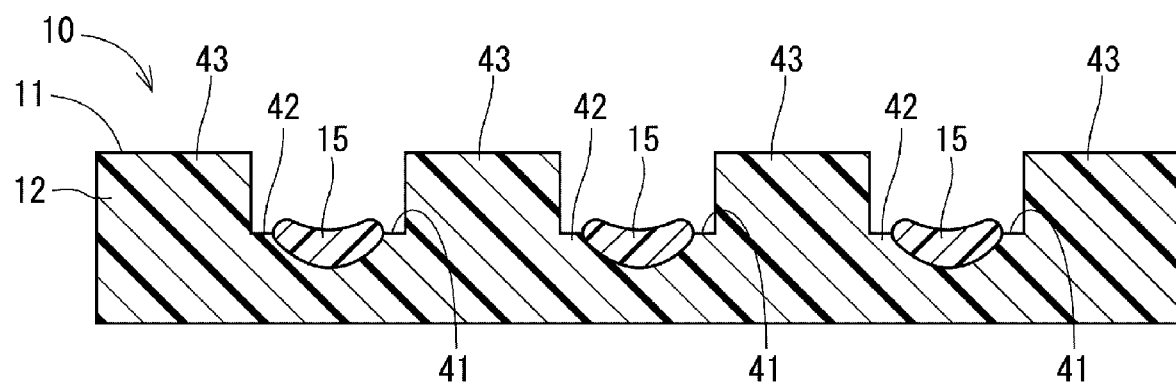
FIG. 12 is a cross-sectional view taken along line XII-XII in FIG. 10.

As shown in FIG. 12, the surface layer of the resin member 10, that is, an alignment layer 12 has recesses 41. The recesses 41 each have a bottom wall 42, which is carbonized into a carbonized portion 15. Between adjacent carbonized portions 15, a rib 43 is formed to enhance the surface insulation. As such, the inner walls of each recess 41 are carbonized to provide ribs 43, each of which is between adjacent carbonized portions 15 to enhance the surface insulation.

Figure 13:
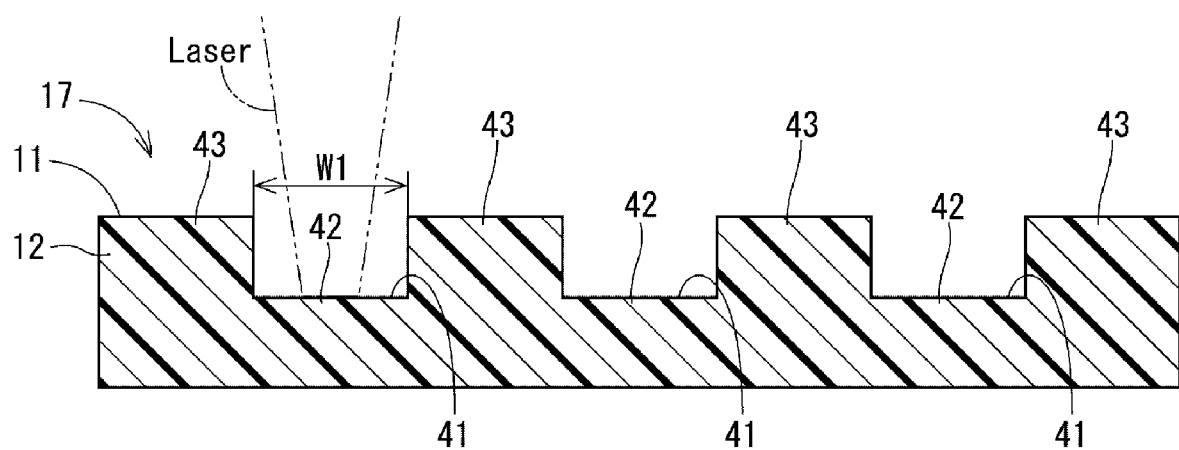
FIG. 13 is a cross-sectional view of a molded article with its alignment layer being irradiated with a laser beam in a carbonization step of a production method according to the second embodiment.

In molding step P1 of the production method according to the second embodiment, as shown in FIG. 13, the recesses 41 are formed in the alignment layer 12 of a molded article 17. In carbonization step P2, the bottom wall 42 of each recess 41 is carbonized by laser beam irradiation. The recess 41 has a groove width W1 greater than the diameter of the convergence laser beam in the recess 41. This enables the bottom wall 42 of the recess 41 to be carbonized in a localized manner.

Third Embodiment

Figure 14:
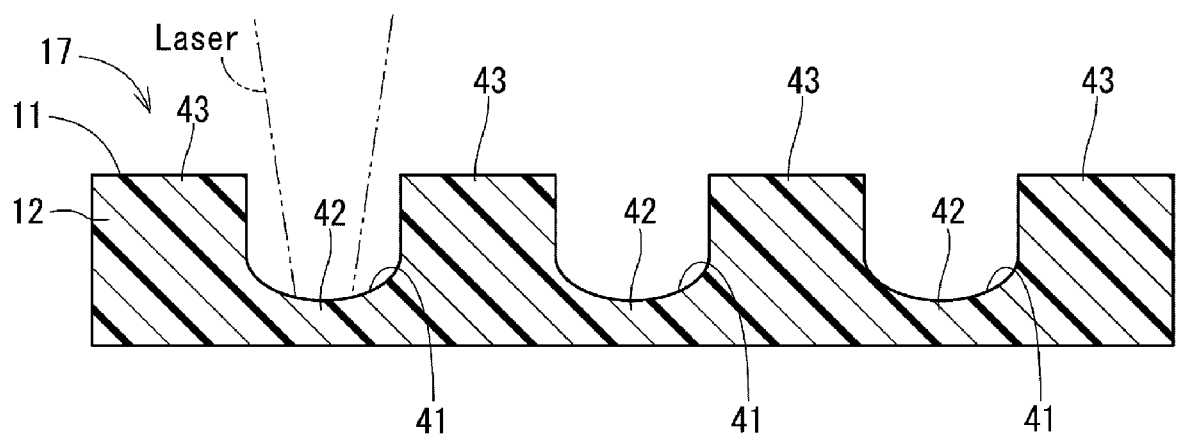
FIG. 14 is a cross-sectional view of a molded article according to a third embodiment, illustrating recesses therein.

In a third embodiment, as shown in FIG. 14, a molded article 17 has recesses 41 with their bottom surfaces rounded. The shape enhances the degree of alignment of the fillers and the molecular chains in the bottom wall 42 of each recess 41.

Fourth Embodiment

Figure 15:
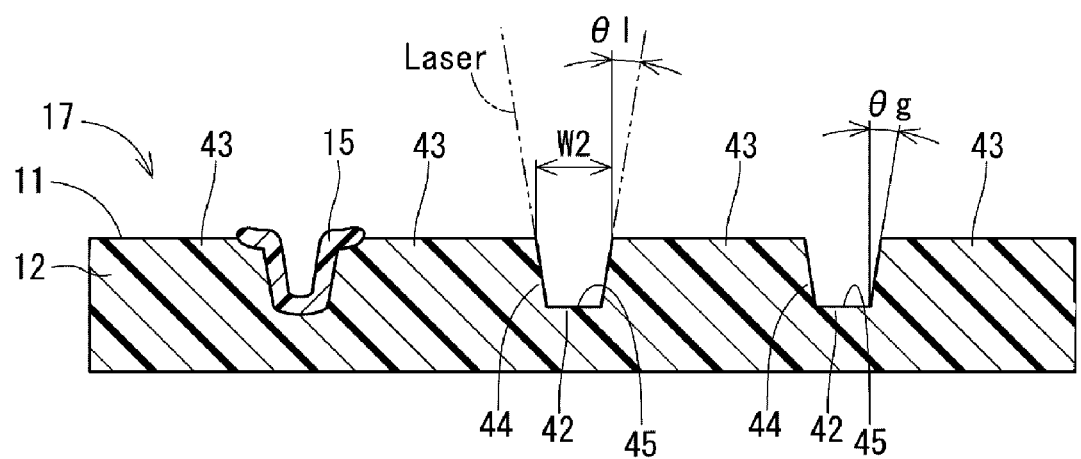
FIG. 15 is a cross-sectional view of a molded article according to a fourth embodiment, illustrating recesses therein.

In a fourth embodiment, as shown in FIG. 15, a molded article 17 has recesses 45 each having a bottom wall 42 and a side wall 44, which are carbonized into a carbonized portion 15. The recess 45 has a groove width W2 equal to or smaller than the diameter of the convergence laser beam at least on the surface of the molded article 17 (i.e., the opening of the recess 45). In the formation of a carbonized portion 15 as an electrically conductive wiring pattern, the cross-sectional area of the carbonized portion 15 is desirably increased in the thickness direction of the resin member 10 in order to enhance the electrical conductivity while narrowing the trace clearance of the electrically conductive pattern. In the fourth embodiment, the recess 45 is preformed in the molded article 17 yet to be carbonized, and the side wall 44 is carbonized to increase the cross-sectional area in the depth direction.

Figure 16:
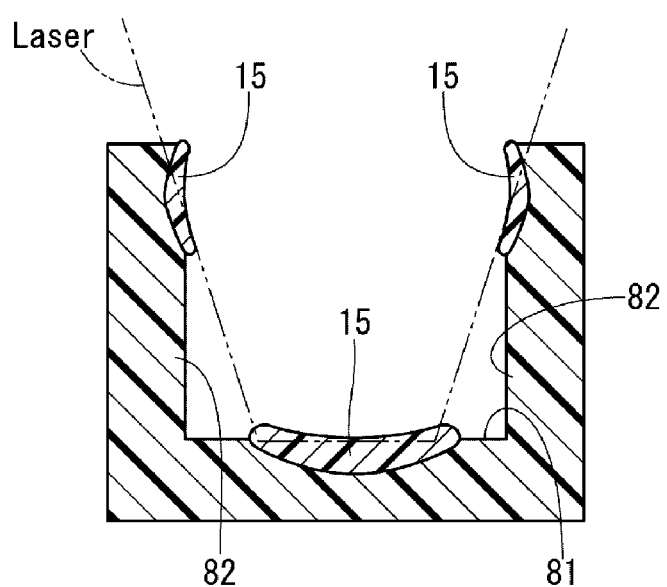
FIG. 16 is a cross-sectional view of a recess in a molded article according to a comparative embodiment.

To reliably irradiate and carbonize the inside corners of the recess 45 with a laser beam, the side wall 44 of the recess 45 has a gradient θg equal to or greater than a laser beam convergence angle θl. In the fourth embodiment, to narrow the trace clearance of the electrically conductive pattern, the gradient θg of the side wall 44 of the recess 45 is approximately equal to the laser beam convergence angle θl. This allows the entire wall surface of the recess 45 to be carbonized and the electrical conductivity to be enhanced. In contrast, in a comparative embodiment with a recess 81 having a side wall surface 82 that is not a gradient as shown in FIG. 16, the inside corners of the recess 81 are not irradiated with a laser beam, resulting in the formation of divided carbonized matter and a lower electrical conductivity.

Fifth Embodiment

Figure 17:
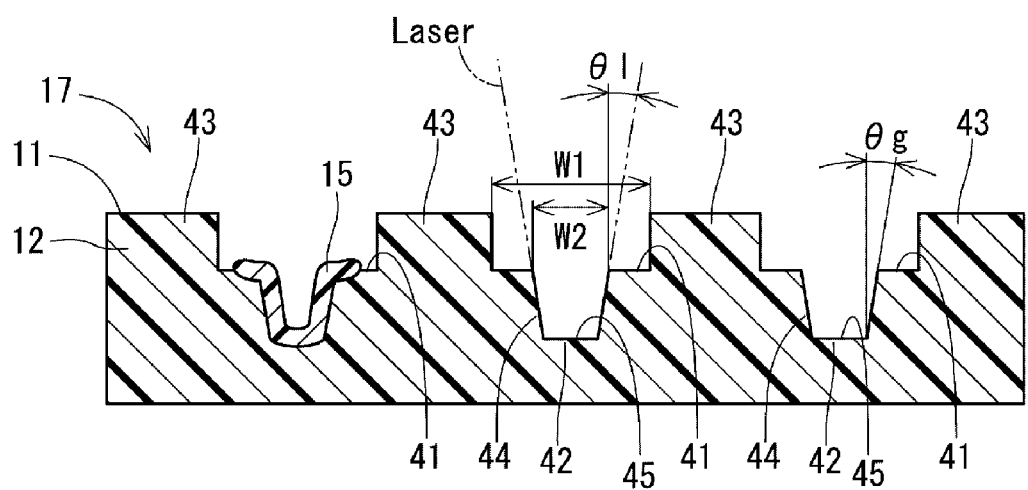
FIG. 17 is a cross-sectional view of a molded article according to a fifth embodiment, illustrating recesses therein.

In a fifth embodiment, as shown in FIG. 17, recesses 45 are formed inside recesses 41. This allows enhancement of the surface insulation between carbonized portions 15 close to each other in the same manner as in the second embodiment, and also enhancement of the electrical conductivity while the trace clearance of the electrically conductive pattern is narrowed in the same manner as in the fourth embodiment.

Sixth Embodiment

Figure 18:
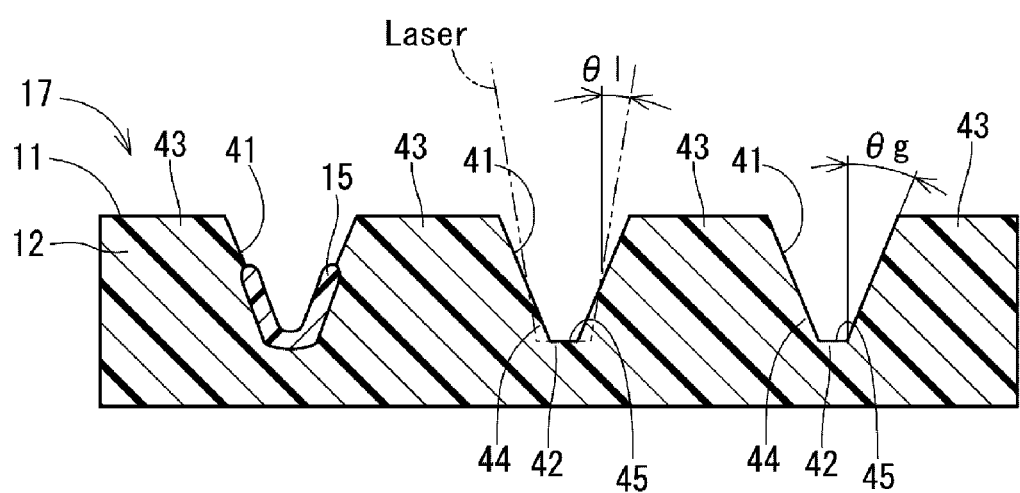
FIG. 18 is a cross-sectional view of a molded article according to a sixth embodiment, illustrating recesses therein.

In a sixth embodiment, as shown in FIG. 18, recesses 45 are formed inside recesses 41 in the same manner as in the sixth embodiment. However, unlike the sixth embodiment, each recess 45 and the recess 41 have a continuous side wall 44. Additionally, the side wall 44 has a gradient θg greater than the laser beam convergence angle θl. The recess 41 has a groove width smaller than the diameter of the convergence laser beam at the same level. As a result, the groove including the recess 41 and the recess 45 has an inner wall portion that is carbonized in the depth direction and increases the cross-sectional area, and an inner wall portion that is not carbonized and enhances the surface insulation. In this manner, the recess 41 and the recess 45 may be even with each other.

Seventh Embodiment

Figure 19:
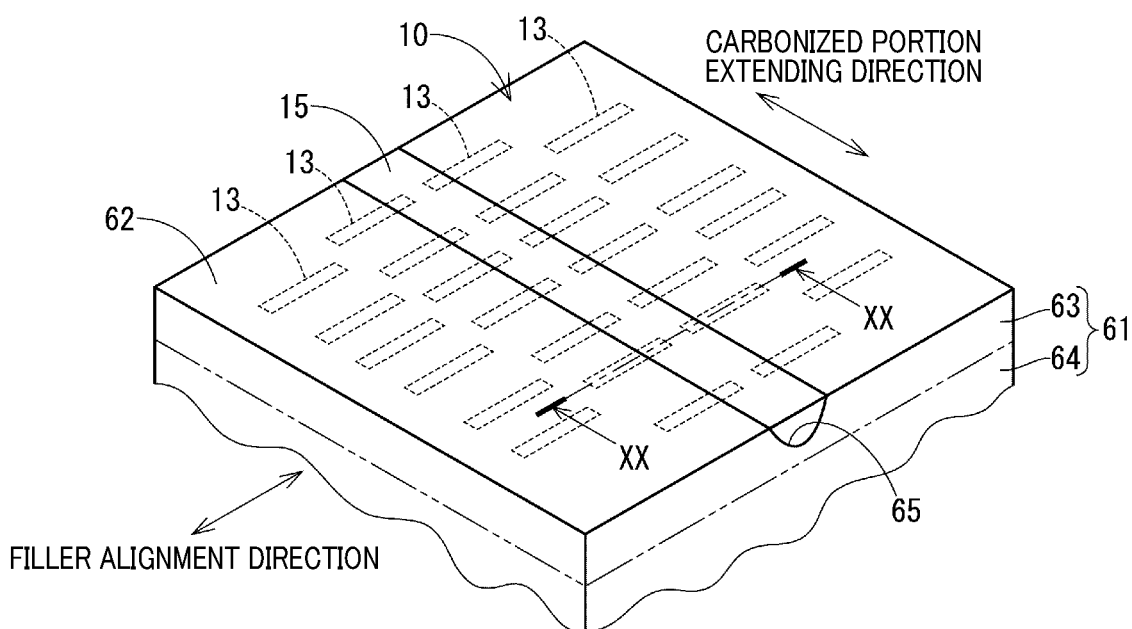
FIG. 19 is a perspective view of a resin member according to a seventh embodiment.

In a seventh embodiment, as shown in FIG. 19, a resin member 10 is a resin body including a resin material and may be used as a housing or a cover for an electronic device such as an air flow meter or a rotation angle sensor. The resin member 10 includes a base portion 61 and a carbonized portion 15.

Figure 20:
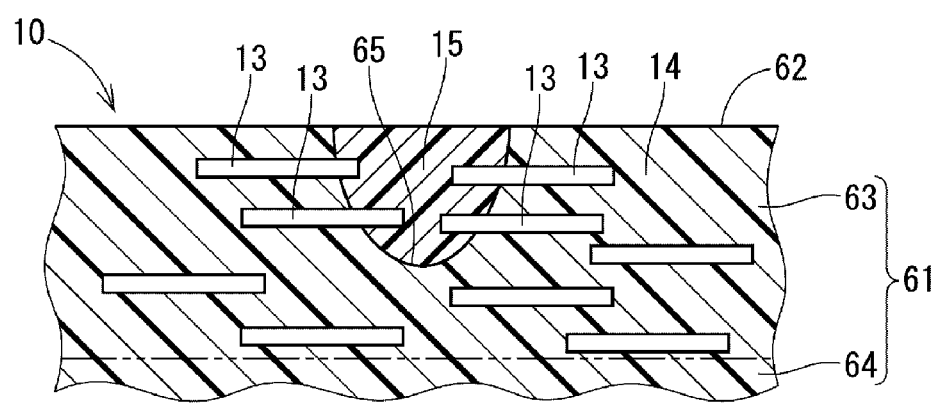
FIG. 20 is a cross-sectional view taken along line XX-XX in FIG. 19.
Figure 21:
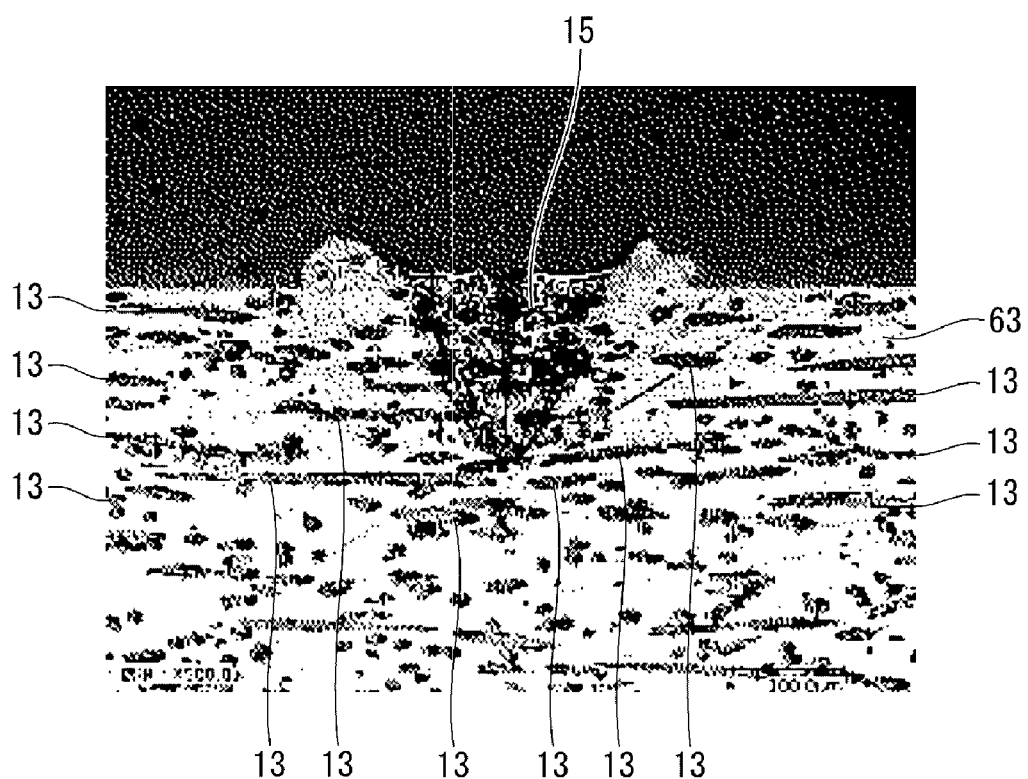
FIG. 21 is a photograph showing the cross section of FIG. 20.

As shown in FIGS. 19, 20, and 21, the base portion 61 includes an insulating base polymer 14 formed from a resin material and filler 13 stronger than the base polymer 14. The base polymer 14 forms the resin portion of the base portion 61. The filler 13 is a reinforcement member that reinforces the base portion 61. The base portion 61 is reinforced by the filler 13 mixed in the base polymer 14.

The carbonized portion 15 is an electrically conductive portion provided in an outer surface 62 of the base portion 61 and having electrical conductivity due to carbonized substances 66 included (see FIG. 8). The carbonized portion 15 is formed as multiple straight lines. The multiple carbonized portions 15 are arranged as a pattern that forms a wiring pattern. The wiring pattern is a current-carrying portion used as circuit wiring in an electronic device such as an air flow meter or a rotation angle sensor.

The carbonized matter is carbon having electrical conductivity (i.e., electrically conductive carbon). The carbonized matter is formed from a carbonized material that is an electrically conductive material, for example, a carbon material such as graphite, carbon powder, carbon fiber, a nano-carbon, graphene, or a carbon micromaterial. Nanocarbons include carbon nanotubes, carbon nanofibers, and fullerenes.

As shown in FIGS. 20 and 21, the resin member 10 includes a skin layer 63 extending along the outer surface 62 of the base portion 61 and a core layer 64 provided inside the skin layer 63. The skin layer 63 is a surface layer forming the outer surface 62 of the base portion 61 and also a solidified layer of molten resin solidified in contact with the inner surface of the mold during the resin molding for the base portion 61. The core layer 64 is a layer of molten resin fluidized inside the solidified layer during the resin molding for the base portion 61. The outer surface 62 of the base portion 61 is the outer surface of the skin layer 63 and also the outer surface of the resin member 10.

The outer surface 62 has a groove recessed surface 65 formed toward the core layer 64. The carbonized portion 15 is provided on the groove recessed surface 65 in a manner to extend from the skin layer 63 toward the core layer 64. The carbonized portion 15 is obtained by carbonizing at least a part of the skin layer 63. The base polymer 14, which is the resin forming the skin layer 63 and the core layer 64, is formed from a material containing at least a 6-membered carbon ring (i.e., a benzene ring).

Of the skin layer 63 and the core layer 64, at least the core layer 64 forms the base portion 61. In the seventh embodiment, the carbonized portion 15 is provided in the skin layer 63 apart from the core layer 64. In other words, the groove recessed surface 65 does not reach the core layer 64, with the carbonized portion 15 adjacent only to the skin layer 63. Both the skin layer 63 and the core layer 64 form the base portion 61.

As shown in FIGS. 19, 20, and 21, in the skin layer 63, more pieces of the filler 13 are aligned in a manner to extend in a predetermined direction along the outer surface 62 of the base portion 61 than in the core layer 64. Hereinafter, the filler 13 aligned in a manner to extend in a predetermined direction is referred to as the aligned filler 13. The carbonized portion 15 extends in a direction crossing the aligned filler 13. In particular, the carbonized portion 15 in the seventh embodiment extends in a direction orthogonal to the aligned filler 13.

Figure 22:
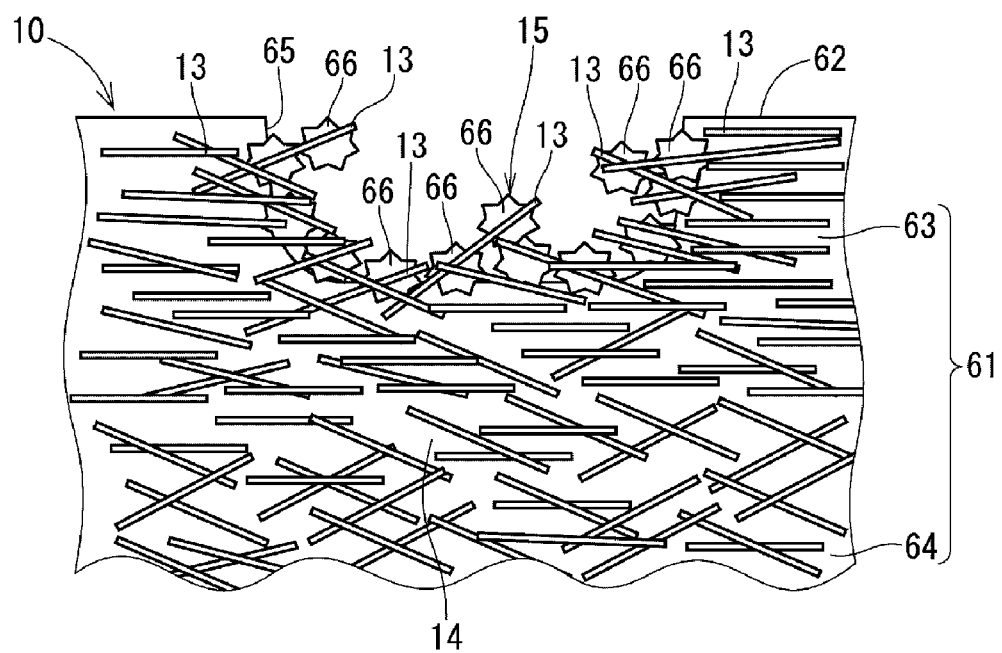
FIG. 22 is a cross-sectional view corresponding to FIG. 20, schematically illustrating pieces of filler caught in carbonized matter.

As shown in FIG. 22, the carbonized portion 15 is a collection of many carbonized substances 66. The filler 13 prevents the carbonized portion 15 from being detach from the base portion 61, with at least pieces of the filler 13 penetrating the carbonized portion 15. In other words, the filler 13 is a restriction member that prevents the carbonized substances 66 from being detach from the carbonized portion 15. The filler 13 may be, as described in the first embodiment, formed from a fibrous, a powdered, or a plate-like material. In the seventh embodiment, the filler 13 is formed from a fibrous material such as flame retardant fiber, glass fiber, or carbon fiber, which forms a fiber portion. In FIG. 22, hatching is omitted for clarity.

Of the filler 13 contained in the base portion 61, the pieces protruding from the groove recessed surface 65 strengthen the bonds between the carbonized portion 15 and the base portion 61, with one end held in the base portion 61 and the other end trapped in the carbonized portion 15. With the filler 13 formed from a fibrous material, longer portions may be trapped. In particular, the aligned filler 13, which crosses the extending direction of the carbonized portion 15, easily protrudes from the groove recessed surface 65 and is readily caught in the carbonized portion 15. In addition, pieces of the aligned filler 13 have penetrated through carbonized substances 66 in the carbonized portion 15, effectively preventing the carbonized substances 66 from coming off.

Figure 23:
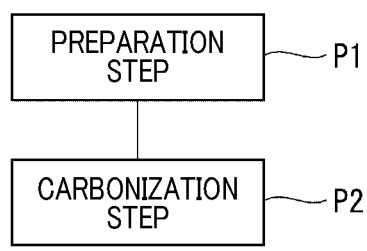
FIG. 23 is a process diagram of a method for producing the resin member according to the seventh embodiment.
Figure 24:
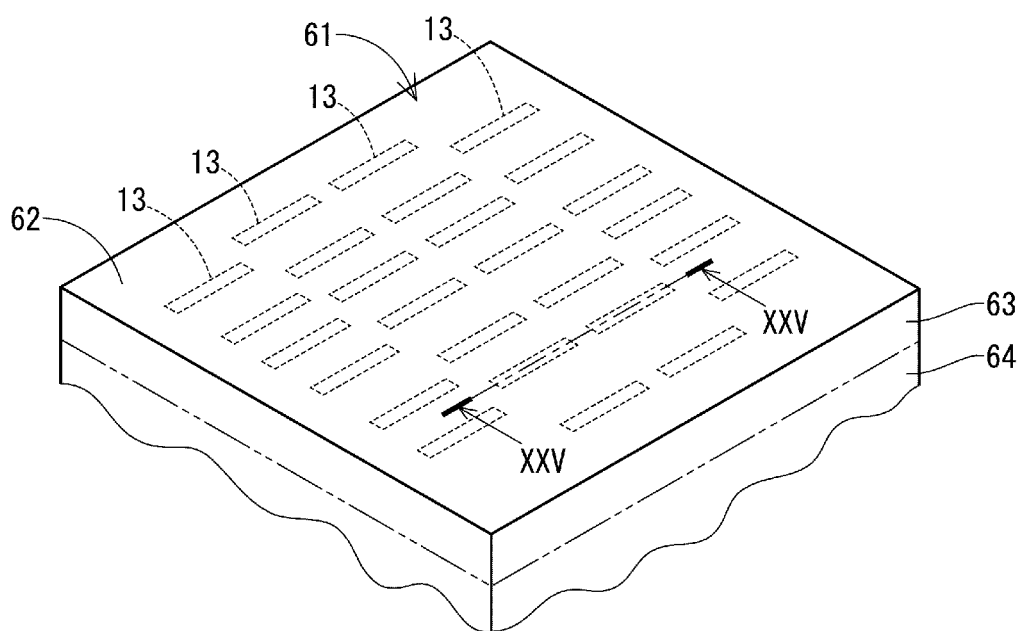
FIG. 24 is a perspective view of a base portion prepared in a preparation step in FIG. 23.
Figure 25:
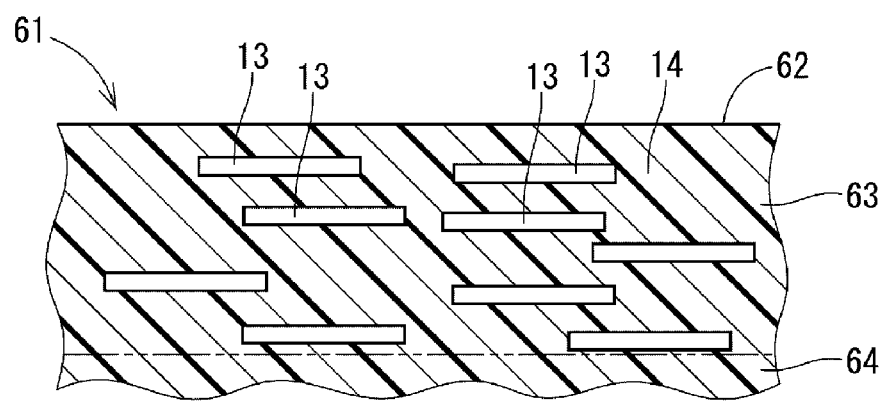
FIG. 25 is a cross-sectional view taken along line XXV-XXV in FIG. 24.

A method for producing the resin member 10, as shown in FIG. 23, includes preparation step P1 and carbonization step P2. In preparation step P1, as shown in FIGS. 24 and 25, the base portion 61 reinforced by the filler 13 mixed in the base polymer 14 is prepared. The range of the preparation in preparation step P1 includes molding the base portion 61 in the same manner as in molding step P1 according to the first embodiment, and also providing the premolded base portion 61 that may be unused or used.

Figure 26:
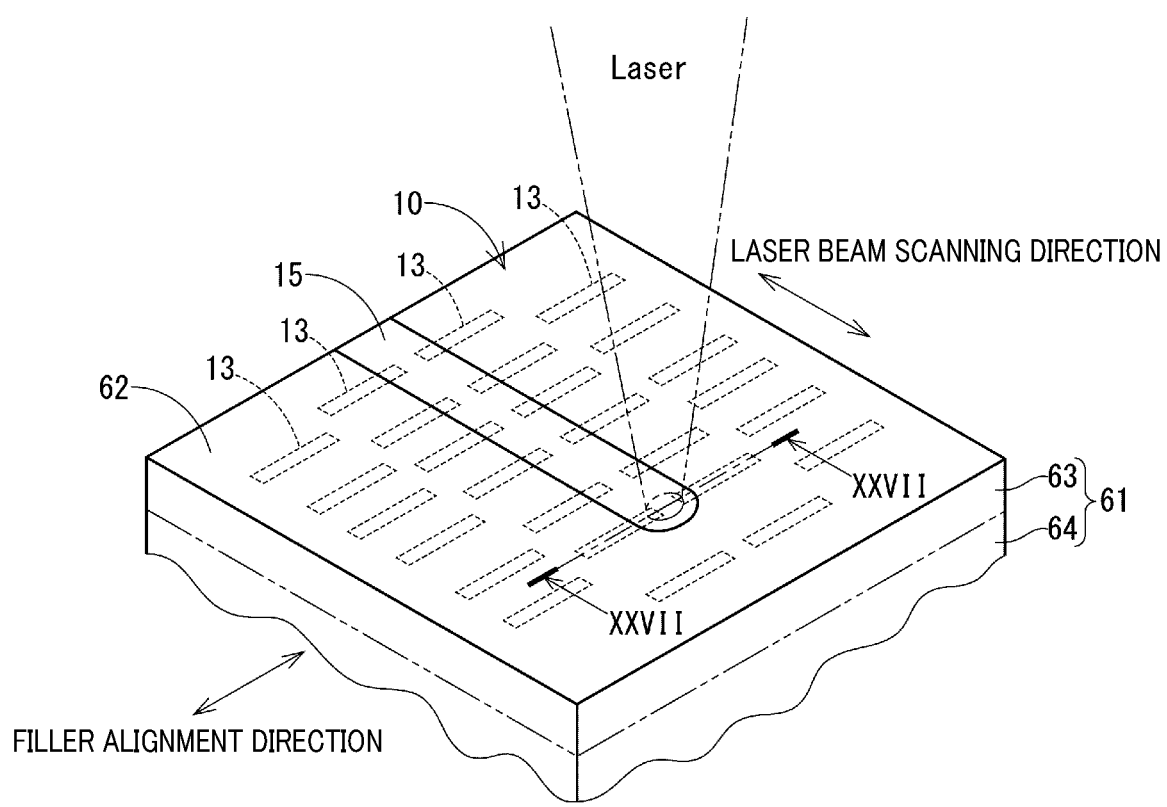
FIG. 26 is a perspective view of the base portion being irradiated with a laser beam in a carbonization step in FIG. 23.
Figure 27:
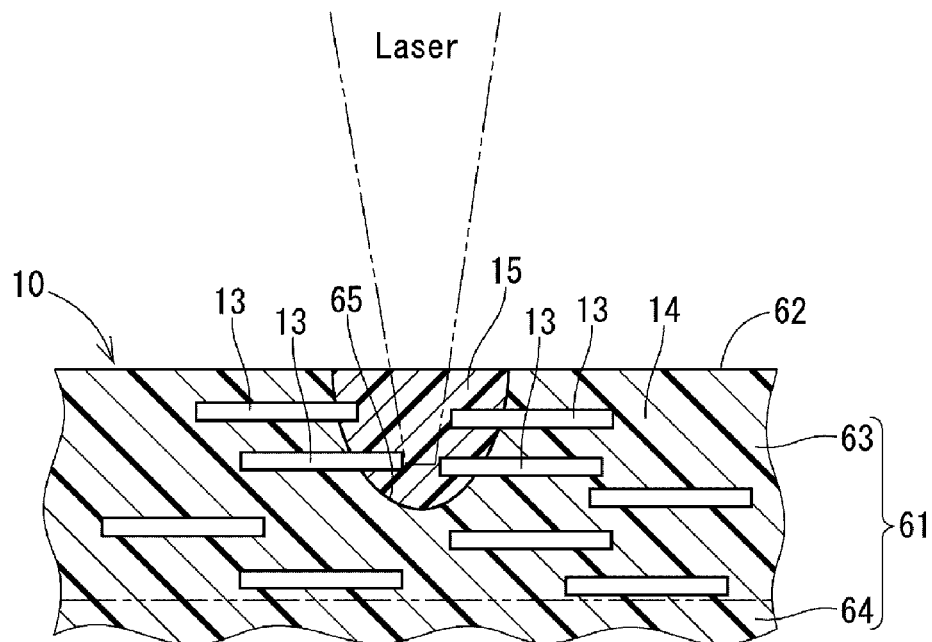
FIG. 27 is a cross-sectional view taken along line XXVII-XXVII in FIG. 26.

In carbonization step P2, as shown in FIGS. 26 and 27, the base portion 61 prepared in preparation step P1 is heated. The heating is performed in a manner to provide the outer surface 62 of the base portion 61 with the carbonized portion 15 that has electrical conductivity due to the included carbonized substances 66 obtained by carbonizing a part of the base polymer 14, and penetrate at least pieces of the filler 13 in the carbonized portion 15 to prevent the carbonized portion 15 from being detach from the base portion 61. The skin layer 63 is heated in a manner to carbonize at least a part of the skin layer 63 into the carbonized portion 15 and form the carbonized portion 15 apart from the core layer 64.

In carbonization step P2, as shown in FIG. 26, the skin layer 63 is heated in a manner to extend the carbonized portion 15 in a direction crossing the filler 13 extending in the skin layer 63 along the outer surface 62 of the base portion 61.

(Effects)

As described above, the resin member 10 in the seventh embodiment includes the base portion 61 and the carbonized portion 15. The base portion 61 includes the insulating base polymer 14 formed from a resin material and the filler 13 stronger than the base polymer 14, and is reinforced by the filler 13 mixed in the base polymer 14. The carbonized portion 15 is provided in the outer surface 62 of the base portion 61 and has electrical conductivity due to the included carbonized substances 66. The filler 13 prevents the carbonized portion 15 from being detach from the base portion 61, with at least pieces of the filler 13 penetrating the carbonized portion 15.

The method for producing the resin member 10 includes preparation step P1 for preparing the base portion 61 and carbonization step P2. In carbonization step P2, the base portion 61 is heated to provide the outer surface 62 of the base portion 61 with the carbonized portion 15 that has electrical conductivity due to the included carbonized substances 66 obtained by carbonizing a part of the base polymer 14, and penetrates at least pieces of the filler 13 in the carbonized portion 15 to prevent the carbonized portion 15 from being detach from the base portion 61.

With the resin member 10 and the method for producing it, the filler 13 will not allow the carbonized substances 66 to be detached after the resin member 10 is produced. This prevents the carbonized portion 15 from decreasing in electrical conductivity due to detachment of the carbonized substances 66. Furthermore, while the base polymer 14 is being carbonized by heating to generate the carbonized portion 15, the filler 13 controls scattering of the carbonized portion 15 caused by generated gas due to decomposition. This prevents decrease in the electrical conductivity of the carbonized portion 15 and division of the carbonized portion 15 caused by scattering of a part of the carbonized portion 15 with heating.

In the first embodiment, the resin member 10 includes the skin layer 63 extending along the outer surface 62 of the base portion 61 and the core layer 64 provided inside the skin layer 63. Of the skin layer 63 and the core layer 64, at least the core layer 64 forms the base portion 61. The outer surface 62 of the base portion 61 has the groove recessed surface 65 formed toward the core layer 64. The carbonized portion 15 is provided on the groove recessed surface 65 in a manner to extend from the skin layer 63 toward the core layer 64. In preparation step P1, the base portion 61 including the skin layer 63 and the core layer 64 is prepared. In carbonization step P2, the skin layer 63 is heated in a manner to carbonize at least a part of the skin layer 63 into the carbonized portion 15.

In the resin member 10, the filler 13 prevents loss of the carbonized portion 15 more easily for the skin layer 63, in which the pieces of filler 13 are aligned regularly, than the core layer 64, in which the pieces of filler 13 are aligned rather irregularly. The resin member 10 and the method for producing it will thus more effectively prevent the carbonized portion 15 from being detached from the core layer 64.

With the carbonized portion 15 provided in the core layer 64, the filler 13 might fail to prevent the carbonized portion 15 from being detached from the core layer 64 because the pieces of filler 13 are aligned rather irregularly in the core layer 64.

In the first embodiment, however, the carbonized portion 15 is provided in the skin layer 63 apart from the core layer 64. In carbonization step P2, the skin layer 63 is heated in a manner to form the carbonized portion 15 apart from the core layer 64. The resin member 10 and the method for producing it will still more effectively prevent the carbonized portion 15 from being detached from the core layer 64 since no carbonized portion 15 is provided in the core layer 64.

With the filler 13 entirely buried in the carbonized portion 15, the filler 13 might be detached from the base portion 61 together with the carbonized portion 15.

In the first embodiment, however, the carbonized portion 15 extends in a direction crossing the filler 13 extending in the skin layer 63 along the outer surface 62 of the base portion 61. In carbonization step P2, the skin layer 63 is heated in a manner to extend the carbonized portion 15 in a direction crossing the filler 13 extending in the skin layer 63 along the outer surface 62 of the base portion 61. With the carbonized portion 15 and the filler 13 crossing each other in this manner, one end of the filler 13 tends to penetrate the base portion 61 with the other end caught in the carbonized portion 15, thus preventing the filler 13 from being detached from the base portion 61 together with the carbonized portion 15.

In the first embodiment, the filler 13 has penetrated through the carbonized substances 66 in the carbonized portion 15. This enables the filler 13 to prevent loss of the carbonized substances 66 more reliably. For the base polymer 14 with polymer portions (i.e., lumps of polymer) penetrated by the filler 13, heating the base polymer 14 carbonizes the polymer portions into the carbonized substances 66 with the filler 13 penetrated therethrough. On the basis of the phenomenon, the filler 13 may be used to prevent scattering of the carbonized substances 66 caused as the base polymer 14 is heated.

Eighth Embodiment

Figure 28:
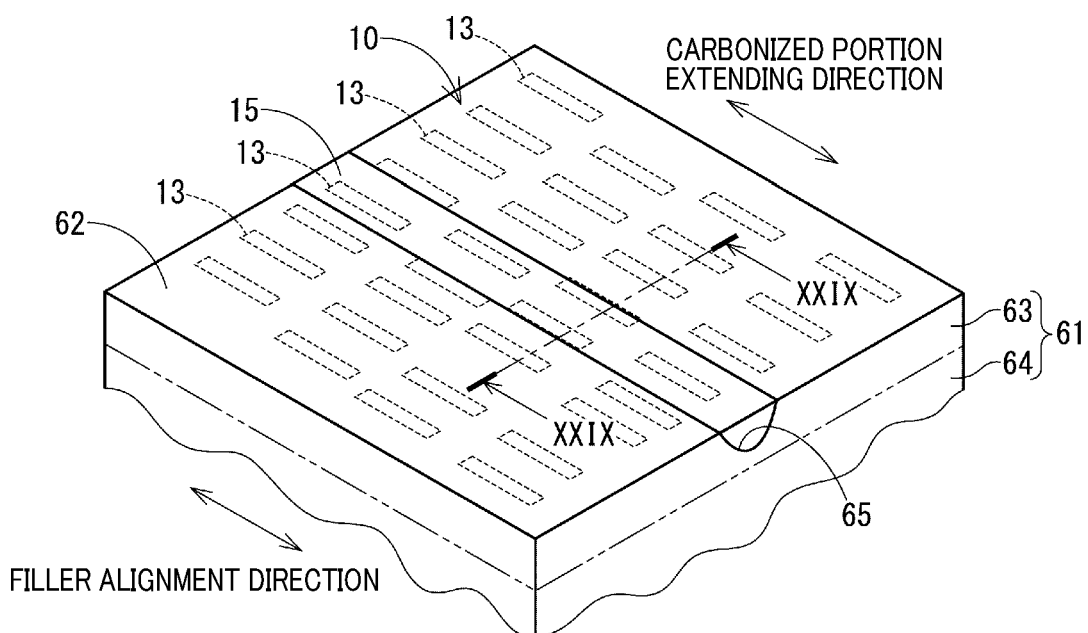
FIG. 28 is a perspective view of a resin member according to an eighth embodiment.
Figure 29:
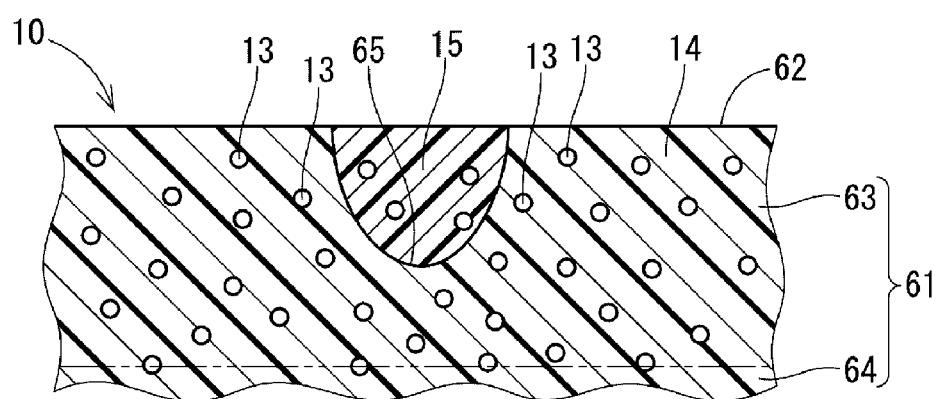
FIG. 29 is a cross-sectional view taken along line XXIX-XXIX in FIG. 28.
Figure 30:
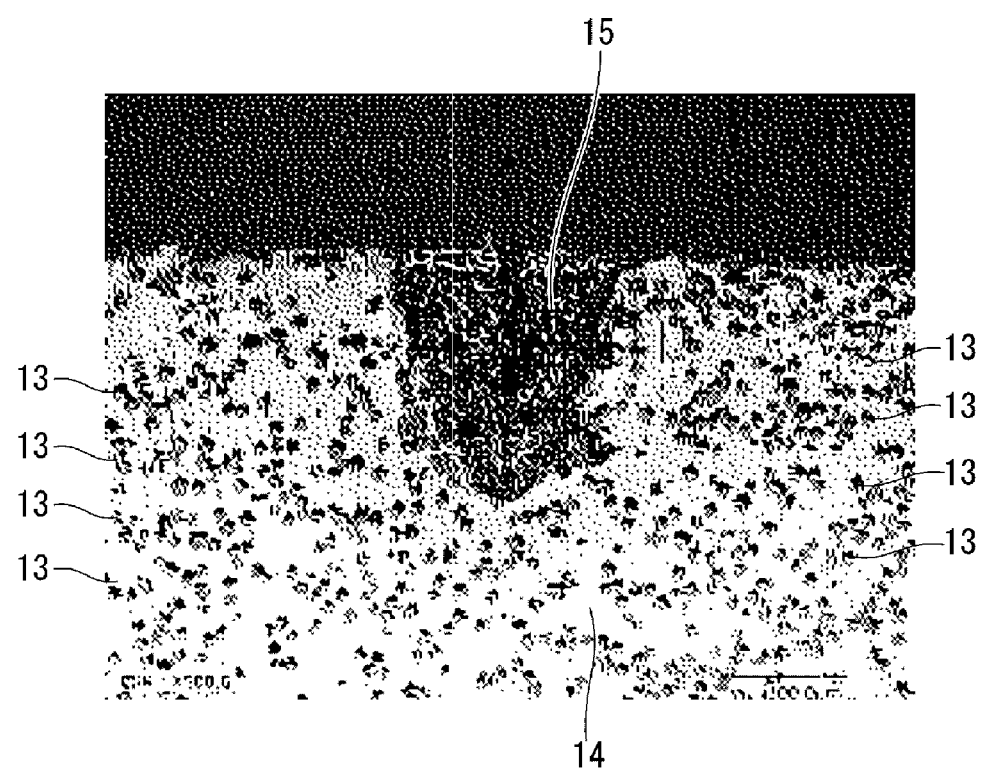
FIG. 30 is a photograph showing the cross section of FIG. 29.
Figure 31:
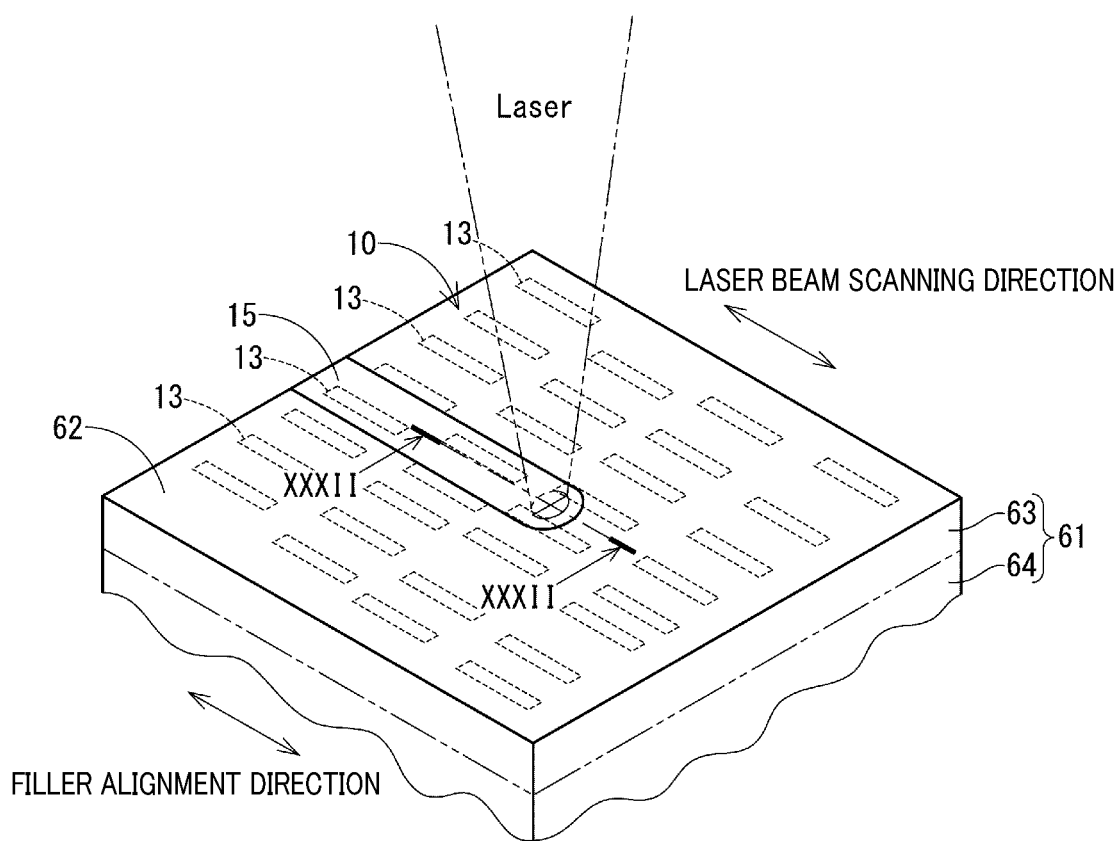
FIG. 31 is a perspective view of a base portion being irradiated with a laser beam in a carbonization step according to the eighth embodiment.
Figure 32:
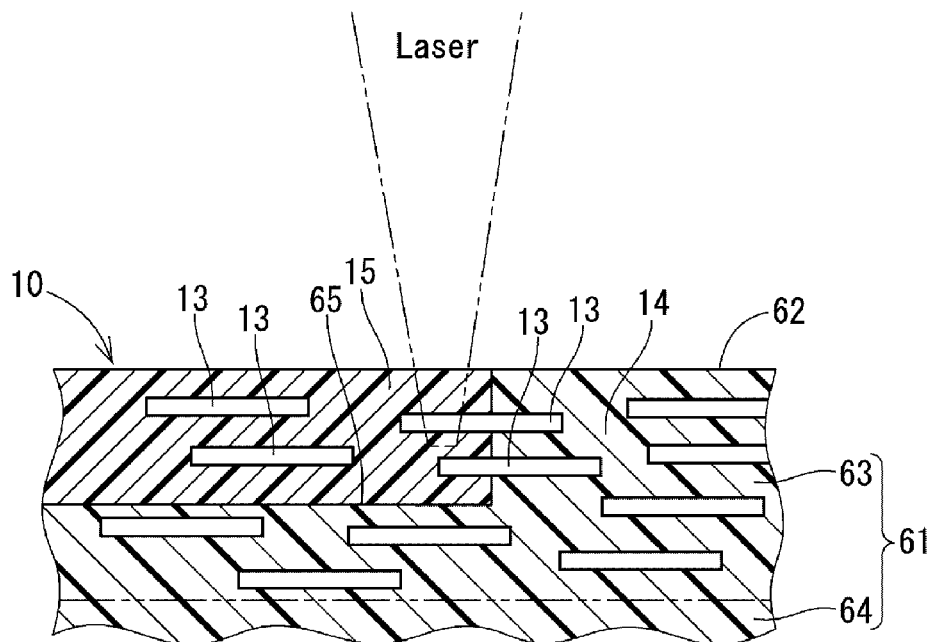
FIG. 32 is a cross-sectional view taken along line XXXII-XXXII in FIG. 31.

In an eighth embodiment, as shown in FIGS. 28 to 30, a carbonized portion 15 extends in a direction parallel to aligned filler 13. In carbonization step P2 (see FIG. 23), as shown in FIGS. 31 to 32, a skin layer 63 is heated by laser beam scanning in a direction parallel to the aligned filler 13 in a manner to extend the carbonized portion 15 in the direction parallel to the aligned filler 13. That is, the laser beam scanning direction is parallel to the alignment direction of the aligned filler 13.

The extension direction of the carbonized portion 15 may not cross the alignment direction of the aligned filler 13 in this manner. As shown in FIG. 31, the filler 13 is fixed in a resin portion that is close to the carbonized portion 15 and not to be carbonized or in a resin portion that is positioned forward in the laser scanning direction on the laser beam path and yet to be irradiated with a laser beam, and during carbonization by laser irradiation, the fixed filler 13 will not allow loss of the carbonized matter caught in the filler 13. In this manner, the carbonized matter is prevented from scattering and being lost, and the fixation is enhanced.

Ninth Embodiment

Figure 33:
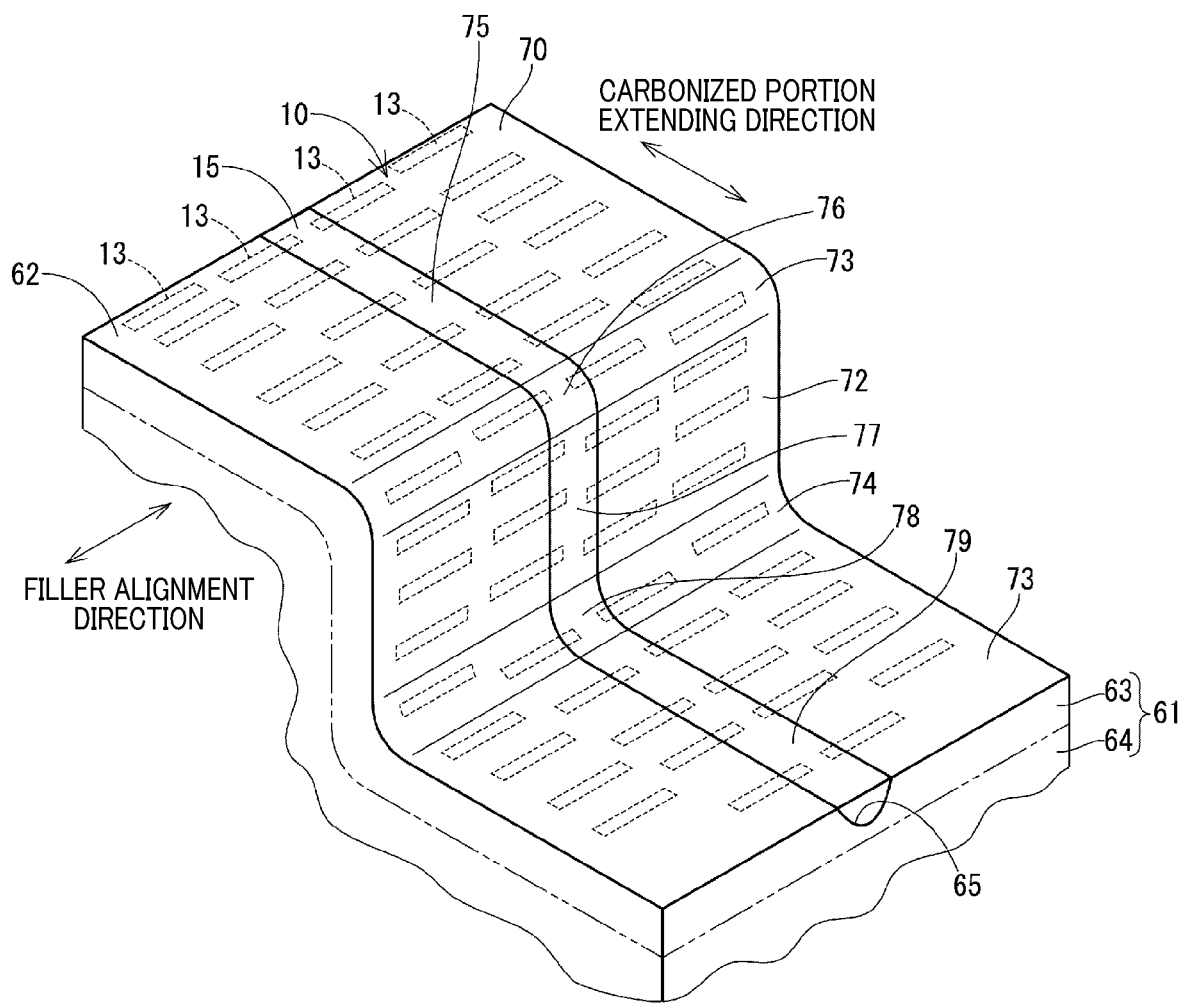
FIG. 33 is a perspective view of a resin member according to a ninth embodiment.

In a ninth embodiment, as shown in FIG. 33, a resin member 10 includes a base portion 61 having, on its outer surface 62, a first surface 70 as a first outer surface, a second surface 71 as a second outer surface extending in a direction crossing the first surface 70, and a rounded surface 73 as a rounded outer surface obtained by rounding the part where the first surface 70 and the second surface 71 meet (i.e., the inside corner). The outer surface 62 also has a third surface 72 as a first outer surface extending in a direction crossing the second surface 71, and a rounded surface 74 as a rounded outer surface obtained by rounding the part where the third surface 72 and the second surface 71 meet (i.e., the outside corner).

A carbonized portion 15 includes a first carbonized portion 75 provided in the first surface 70, a second carbonized portion 76 provided in the second surface 71, and a connection carbonized portion 78 provided in the rounded surface 73 and connecting the first carbonized portion 75 and the second carbonized portion 76. The carbonized portion 15 also includes a third carbonized portion 77 provided in the third surface 72, and a connection carbonized portion 79 provided in the rounded surface 74 and connecting the second carbonized portion 76 and the third carbonized portion 77.

A comparative embodiment will now be described in which two surfaces cross, their corner is not rounded, and the two surfaces are connected directly to each other. In this comparative embodiment, the corner contains little filler, and the proportion of the base polymer 14 is relatively high. During laser irradiation, the temperature will thus increase too sharply, rapidly generating gas due to decomposition and scattering the carbonized matter This may easily break the electrical connection of the carbonized portion in the corner. Furthermore, as the resin member deforms slightly, stress may concentrate on the corner, physically separating the carbonized portions in the two surfaces, and a disconnection may occur at the carbonized portion in the corner.

In the ninth embodiment, however, the corner between the first surface 70 and the second surface 71 is rounded, and the connection carbonized portion 78 is provided in the rounded surface 73. In addition, the corner between the second surface 71 and the third surface 72 is rounded, and the connection carbonized portion 79 is provided in the rounded surface 74. The connection carbonized portions 78, 79 prevent electrical interruption in the boundary between the first carbonized portion 75 and the second carbonized portion 76 and the boundary between the second carbonized portion 76 and the third carbonized portion 77.

Figure 34:
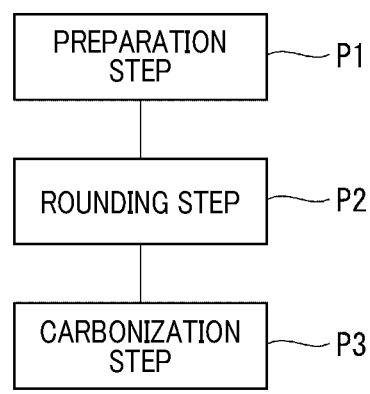
FIG. 34 is a process diagram of a method for producing the resin member according to the ninth embodiment.
Figure 35:
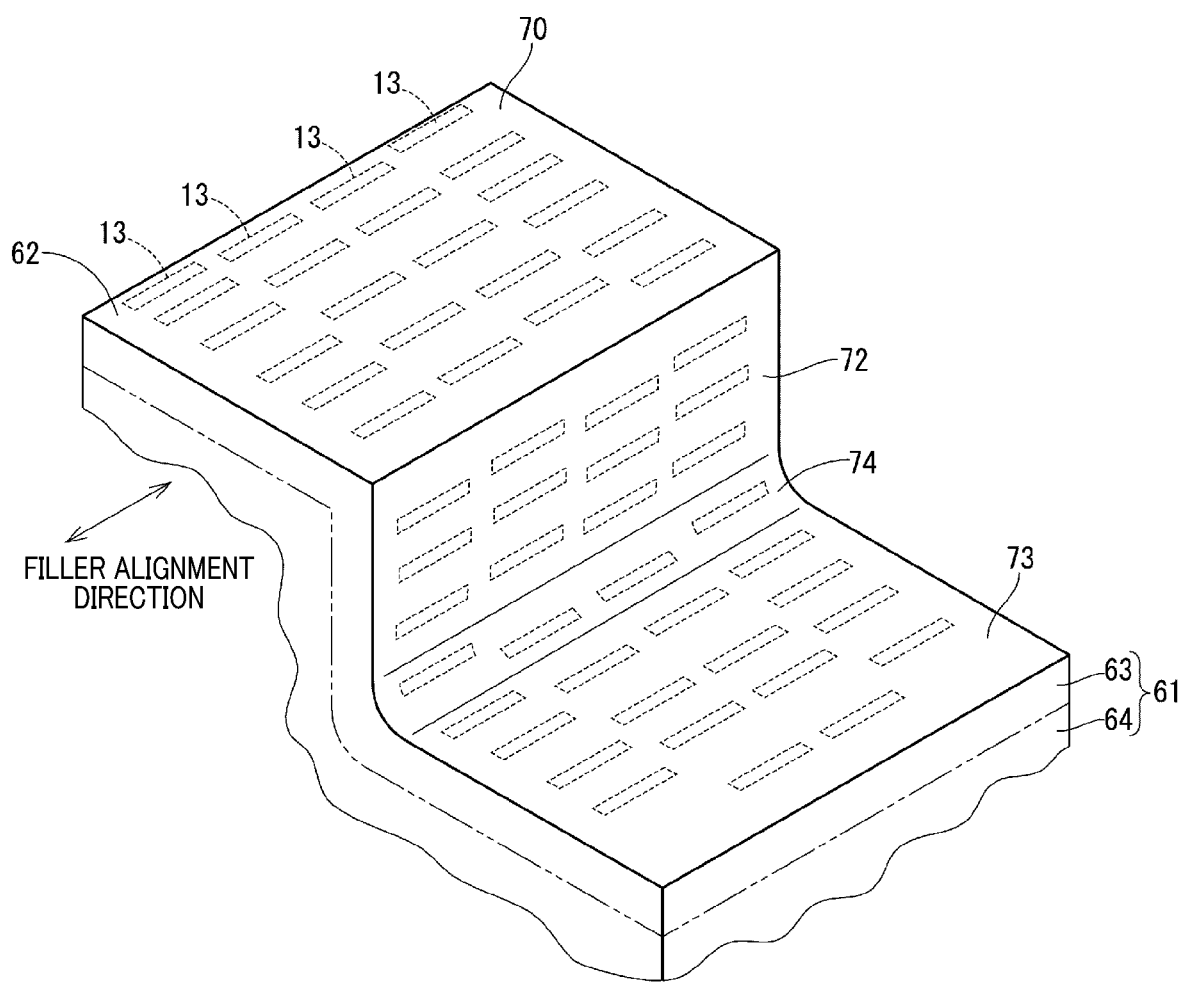
FIG. 35 is a perspective view of a base portion prepared in a preparation step in FIG. 34.

The method for producing the resin member 10, as shown in FIG. 34, includes preparation step P1, rounding step P2, and carbonization step P3. In preparation step P1, as shown in FIG. 35, the base portion 61 is prepared that includes three surfaces crossing each other: the first surface 70, the second surface 71, and the third surface 72. The part where the third surface 72 and the second surface 71 meet is formed as the rounded surface 74 during the resin molding for the base portion 61. In contrast, the part where the first surface 70 and the second surface 71 meet is a sharp corner (i.e., an edge that is not rounded).

Figure 36:
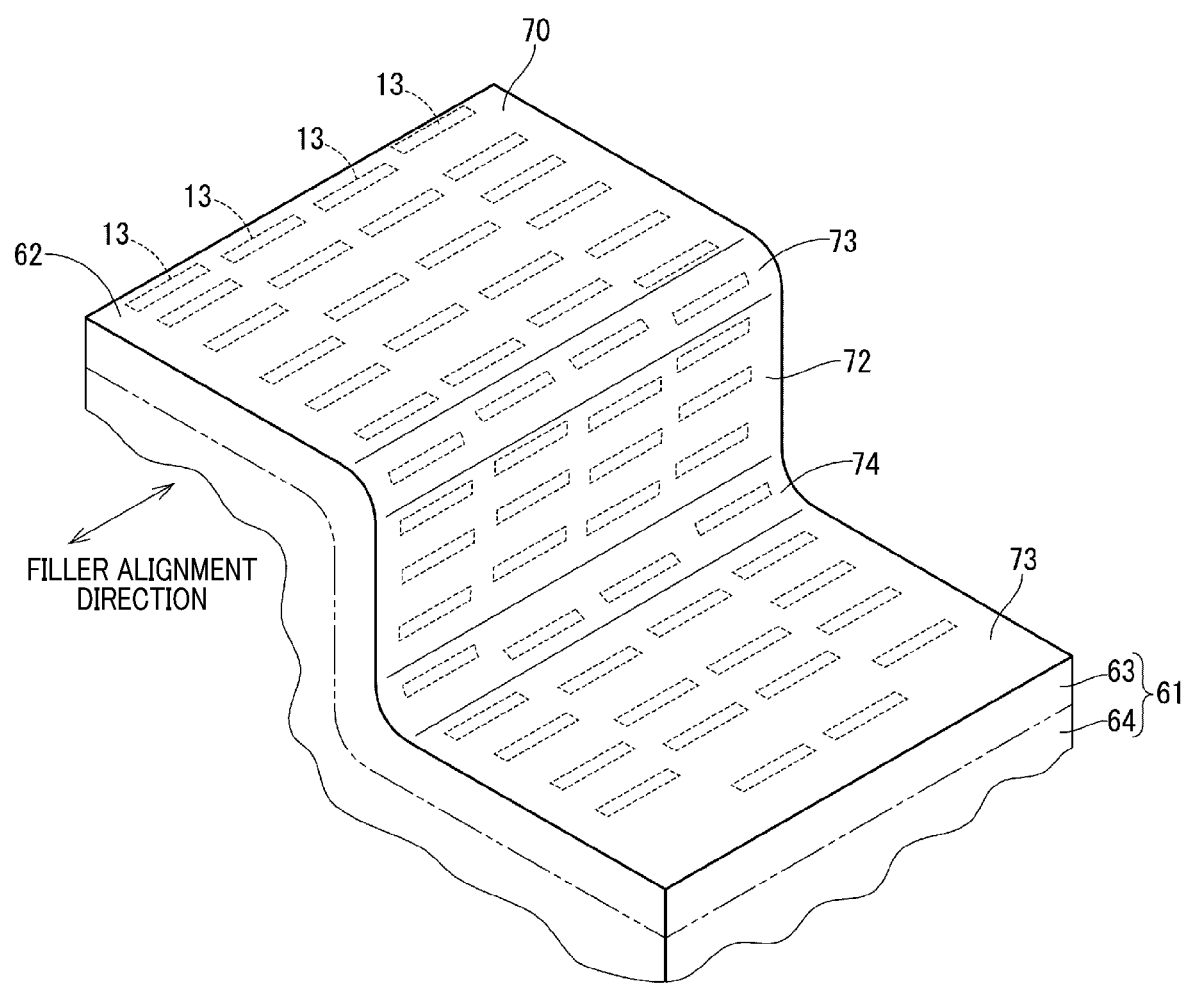
FIG. 36 is a perspective view of the base portion after being rounded in a rounding step in FIG. 34.

In rounding step P2, as shown in FIG. 36, the part where the first surface 70 and the second surface 71 meet is rounded to form the rounded surface 73. The rounding is achieved by eliminating the sharp corner by laser irradiation.

Figure 37:
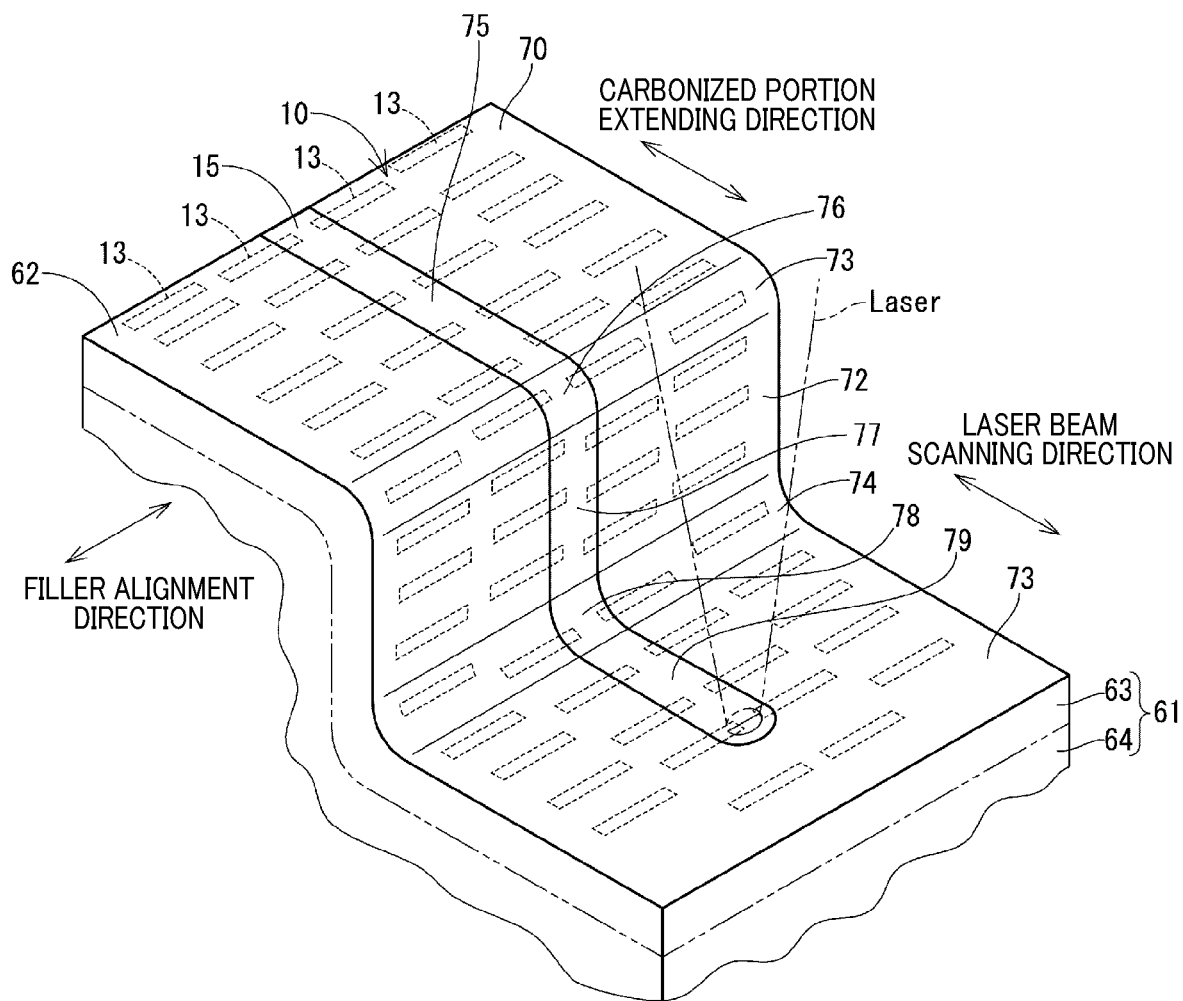
FIG. 37 is a perspective view of the base portion being irradiated with a laser beam in a carbonization step in FIG. 34.

In carbonization step P3, as shown in FIG. 37, the base portion 61 is heated in a manner to provide the outer surface 62 of the base portion 61 with, as the carbonized portion 15, the first carbonized portion 75 extending along the first surface 70, the second carbonized portion 76 extending along the second surface 71, and the connection carbonized portion 78 extending along the rounded surface 73 and connecting the first carbonized portion 75 and the second carbonized portion 76. Additionally, as the carbonized portion 15, the base portion 61 is heated in a manner to provide the outer surface 62 of the base portion 61 with the third carbonized portion 77 extending along the third surface 72, and the connection carbonized portion 79 extending along the rounded surface 74 and connecting the third carbonized portion 77 and the second carbonized portion 76.

A production method will now be described for forming the first carbonized portion 75, the second carbonized portion 76, and the third carbonized portion 77 before forming the connection carbonized portions 78, 79. In this production method, when the carbonized portion 15 is formed, the first carbonized portion 75 and the second carbonized portion 76 might not be connected by the connection carbonized portion 78, and the second carbonized portion 76 and the third carbonized portion 77 might not be connected by the connection carbonized portion 79.

In the ninth embodiment, however, in carbonization step P3, the base portion 61 is heated continuously from the first surface 70 to the second surface 71 via the rounded surface 73 to connect the first carbonized portion 75 and the second carbonized portion W via the connection carbonized portion 78. In addition, the base portion 61 is heated continuously from the second surface 71 to the third surface 72 via the rounded surface 74 so that the second carbonized portion 76 and the third carbonized portion W are connected by the connection carbonized portion 79. As a result, when the carbonized portion 15 is formed, the first carbonized portion 75 and the second carbonized portion 76 are connected more reliably by the connection carbonized portion 78, and the second carbonized portion 76 and the third carbonized portion 77 are connected more reliably by the connection carbonized portion 79.

Tenth Embodiment

Figure 38:
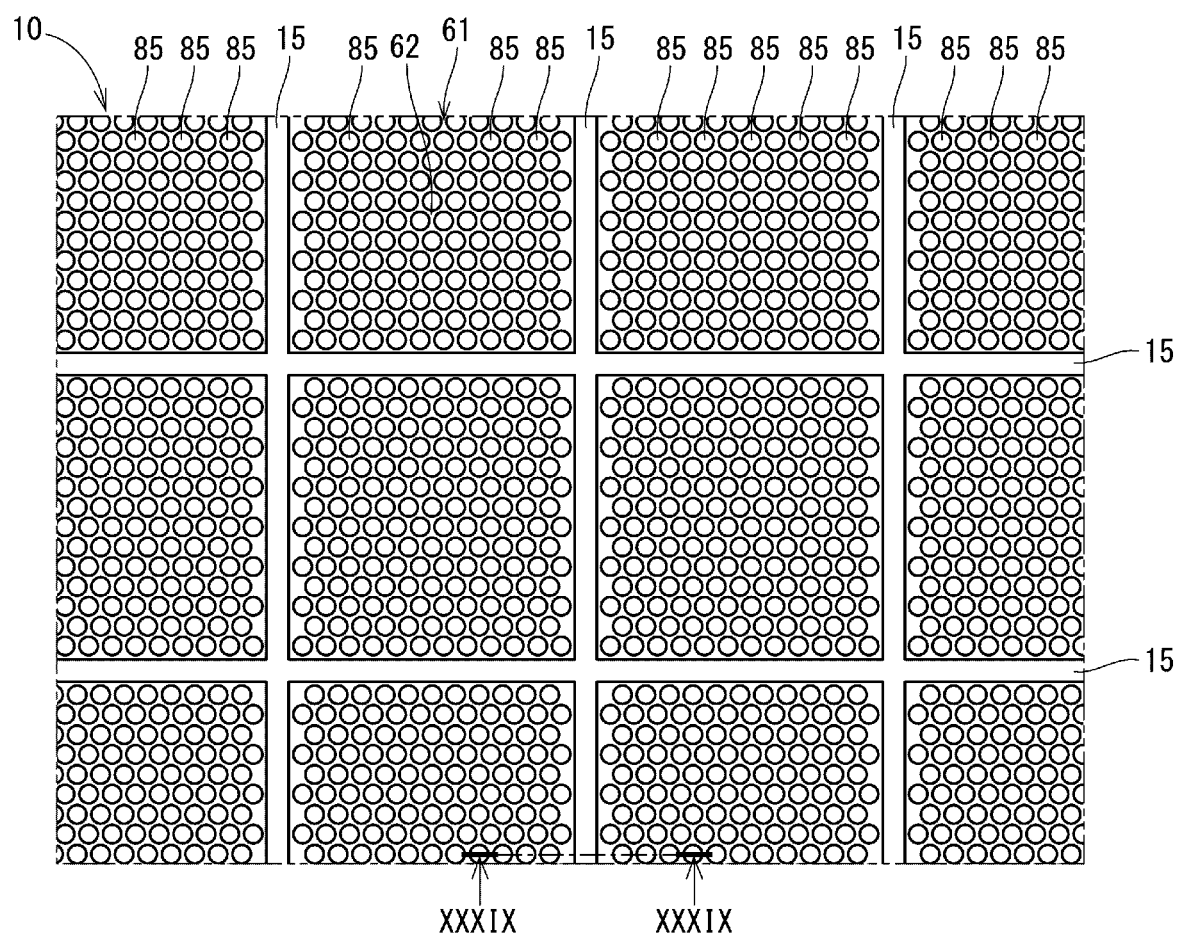
FIG. 38 is an enlarged photograph of the front of a resin member according to a tenth embodiment.
Figure 39:
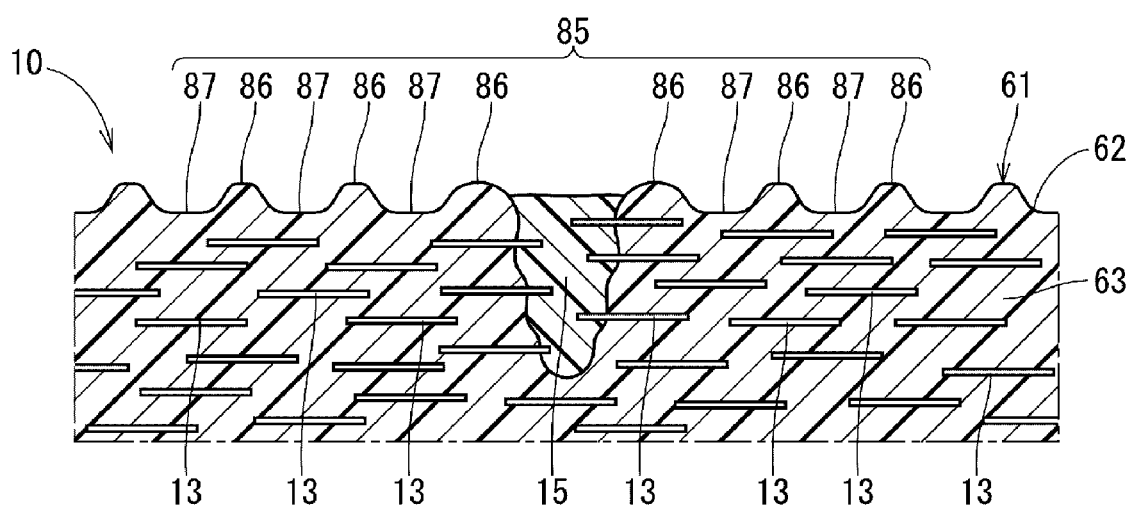
FIG. 39 is a cross-sectional view taken along line XXXIX-XXXIX in FIG. 38.

In a tenth embodiment, as shown in FIGS. 38 and 39, a carbonized portion 15 is formed as a grid. The carbonized portion 15 is, for example, provided in the outer wall surface of a housing for an electronic device such as an air flow meter or a rotation angle sensor and used as a static elimination circuit.

A base portion 61 has an outer surface 62 with a deformation 85 provided in a manner to extend along the peripheral edges of the carbonized portion 15. The deformation 85 is obtained by deforming a part of the base portion 61. In the tenth embodiment, the deformation 85 results from melting and solidification. In other embodiments, the deformation 85 may result from, for example, removal by machining such as laser processing or polishing, or dissolving with a solution. When the carbonized portion 15 is formed, foreign matter such as scattered substances may adhere to the base portion 61. Even in such a case, the foreign matter may be removed from the base portion 61 when the deformation 85 is provided. Thus, providing the deformation 85 prevents the foreign matter from degrading the design quality of the base portion 61.

The deformation 85 includes a foamed area 86 in which at least a part of the base portion 61 has been foamed, and a plurality of dot-like recesses 87 provided in the outer surface 62 of the base portion 61. The foamed area 86 and the dot-like recesses 87 are deformations that may be provided by heating the base portion 61.

Figure 40:
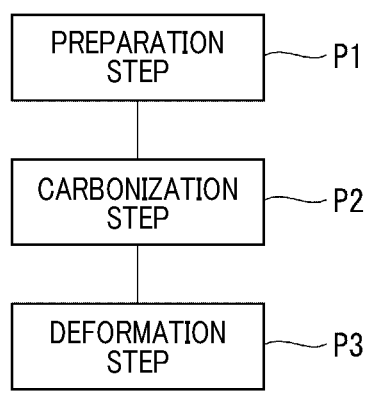
FIG. 40 is a process diagram of a method for producing the resin member according to the tenth embodiment.

A method for producing the resin member 10, as shown in FIG. 40, includes preparation step P1, carbonization step P2, and deformation step P3. In deformation step P3, after carbonization step P2, at least a part of the base portion 61 is deformed to extend the deformation 85 along the peripheral edges of the carbonized portion 15 in the outer surface 62 of the base portion 61. In deformation step P3, at least a part of each of the base portion 61 and the carbonized portion 15 is heated at a temperature lower than in the heating of the base portion 61 in carbonization step P2, to provide the deformation 85 in the outer surface 62 of the base portion 61.

If foreign matter produced during the heating in carbonization step P2 remains on the outer surface 62 of the base portion 61, the foreign matter may interfere with electric charge emission by the carbonized portion 15.

In the tenth embodiment, however, the heating in deformation step P3 can burn off the foreign matter remaining on the base portion 61.

If the carbonized portion 15 includes a part that barely remains on the base portion 61 in an unstable posture, a change in the posture of the part will vary the ease of passage of electric charge in the carbonized portion 15. In this case, the electrical conductivity of the carbonized portion 15 might vary depending on the posture of the part, resulting in unstable electrical conductivity.

In the tenth embodiment, however, when the deformation 85 is provided, the base portion 61 as well as a part of the carbonized portion 15 are removed. Of the carbonized portion 15, a site in an unstable posture is removed more easily than a site in a stable posture. More specifically, in deformation step P3, the base portion 61 as well as the carbonized portion 15 are heated, so that the site of the carbonized portion 15 in an unstable posture can be removed by heating or burning. This enables variations in the electrical conductivity of the carbonized portion 15 to be suppressed, stabilizing the electrical conductivity of the carbonized portion 15.

The carbonized portion 15 may also be trimmed to control the resistance of the carbonized portion 15 to a predetermined value.

In carbonization step P2, the base portion 61 is heated by applying an electromagnetic wave such as a laser beam to the base portion 61 to form the carbonized portion 15. In deformation step P3, the base portion 61 is heated to provide the deformation 85 by irradiating the base portion 61 with an electromagnetic wave at a higher scan rate at a lower frequency with a lower intensity (i.e., output) than those of the electromagnetic wave applied to the base portion 61 in carbonization step P2.

In this manner, both the carbonized portion 15 and the deformation 85 can be formed by electromagnetic wave irradiation. This reduces the workload of forming the carbonized portion 15 and the deformation 85. If, for example, carbonization step P2 and deformation step P3 are performed continuously, the base portion 61 may not be aligned twice or more with the apparatus that applies electromagnetic waves.

When the deformation 85 is provided using a laser, the resin may foam and change in color depending on the laser energy. However, such foaming and change in color can be caused deliberately in order to provide design quality. When the deformation 85 is provided using a laser, a pulse laser is desirable because of its suitability for removal processing. A pulse laser may be used to form the dot-like recesses 87 periodically.

Examples will be described below. In each example, for both cost efficiency and electrical conductivity, a relatively high-output laser beam was used to perform processing in a short time. However, for electrical conductivity enhancement, a relatively low-output laser beam may also be used to perform processing for a long time. In such a case, the rate of rise in temperature will decrease, and the electrical conductivity is expected to increase further.

Example 1

Figure 41:
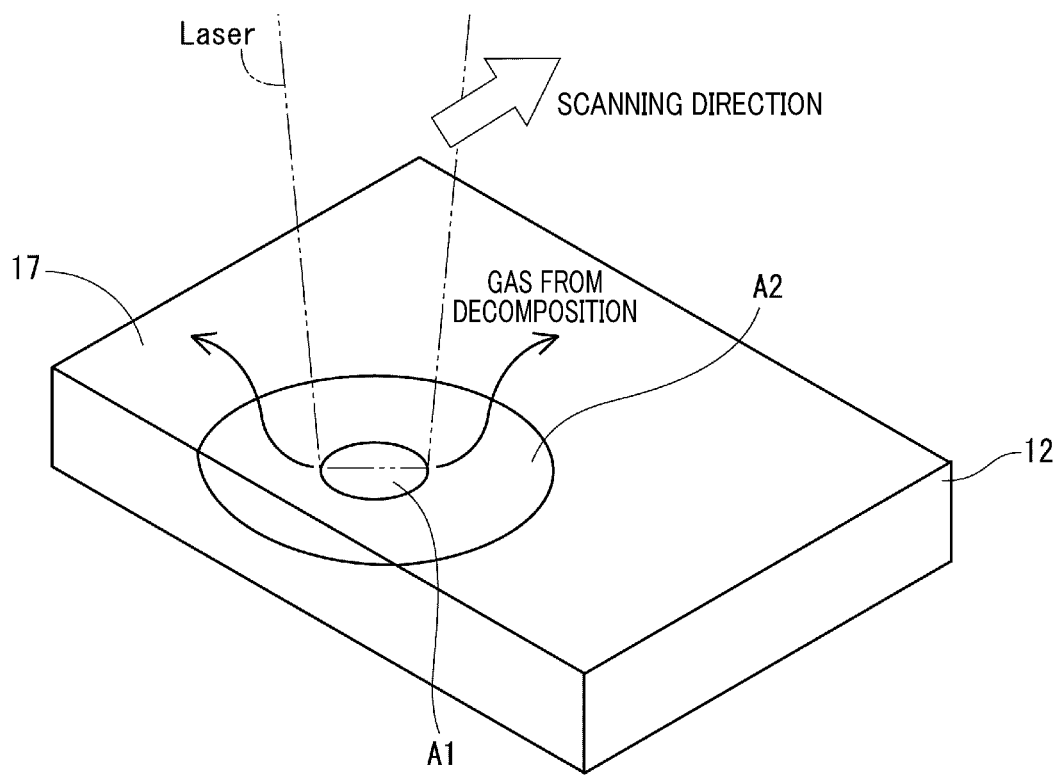
FIG. 41 is a perspective view of a molded article with its alignment layer being irradiated with a laser beam at the initial stage of a carbonization step in Example 1.
Figure 42:
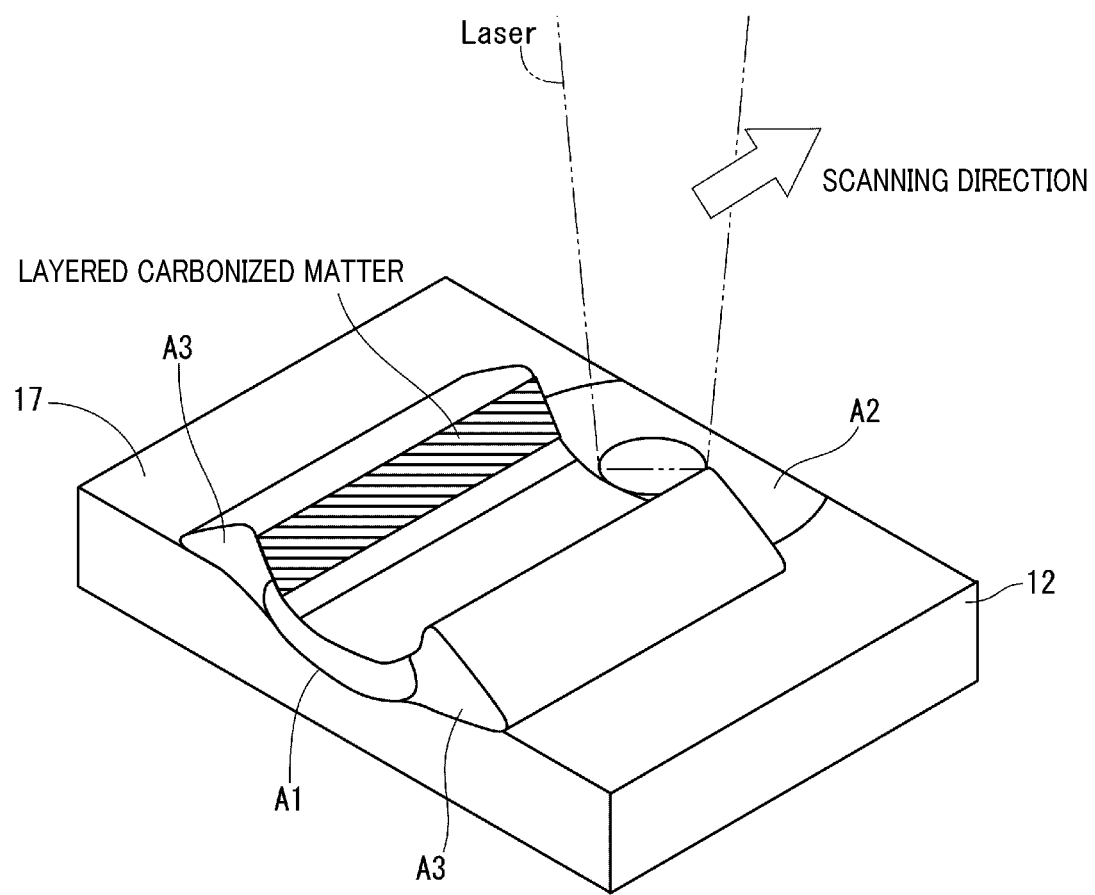
FIG. 42 is a perspective view of the molded article with its alignment layer being irradiated with a laser beam at the final stage of the carbonization step in Example 1.

In Example 1, as shown in FIG. 41, the molded article 17 is formed from an insulating resin material having a volume resistivity of $10^{13}$ Ωm or more with 40 wt % glass fiber added as filler to a base polymer containing polyphenylene sulfide as a main component. The alignment layer 12 is formed at a depth of at least 0.3 mm or more from the surface of the molded article 17. As shown in FIGS. 41 and 42, the molded article 17 shaped as a plate with a width and a depth of 80 mm, and a thickness of 3 mm was placed in an argon atmosphere at a pressure of 0.15 MPa, and the alignment layer 12 under a predetermined site on the surface of the molded article 17 was scanned using a semiconductor laser adjusted to an approximately focal length to the surface, with an oscillation wavelength of 940 nm and a convergence diameter of 0.6 mm. The laser scanned a 40-mm straight section with an output of 100 W at a rate of 50 mm/s to carbonize the part of the alignment layer 12.

As shown in FIGS. 41 and 42, the site on the alignment layer 12 irradiated with a laser beam (hereinafter, a first area A1) increases in temperature to about 2,300° C. to 2,500° C., and vigorously generates hot gas due to decomposition. In this state, the resin material foams into swellings, while the laser beam evaporates and removes them. As a result, the first area A1 has a recess, in which carbonized matter has a porous structure.

Figure 43:
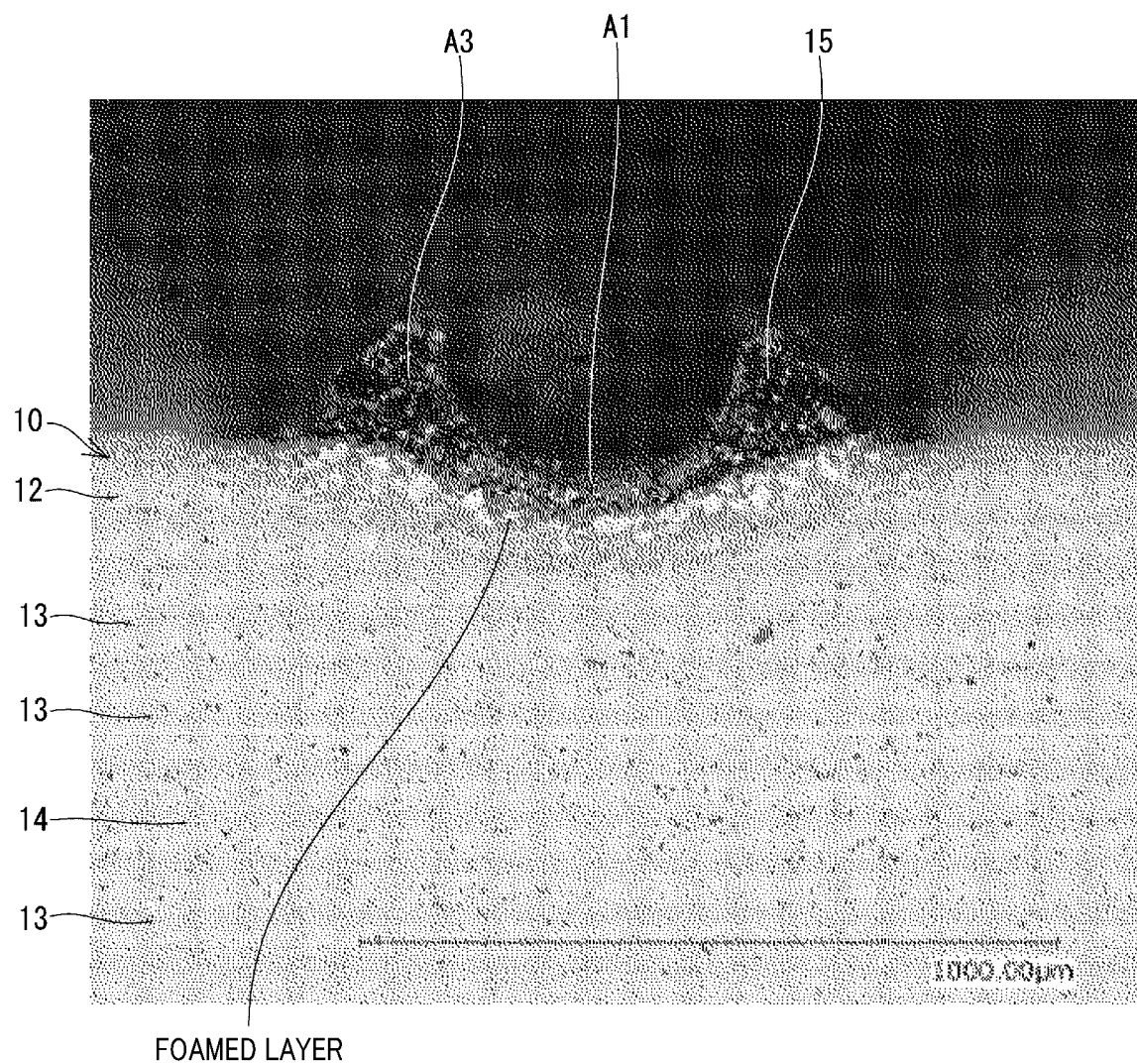
FIG. 43 is a photograph showing the edge of a carbonized portion formed in the alignment layer in the carbonization step in Example 1.
Figure 44:
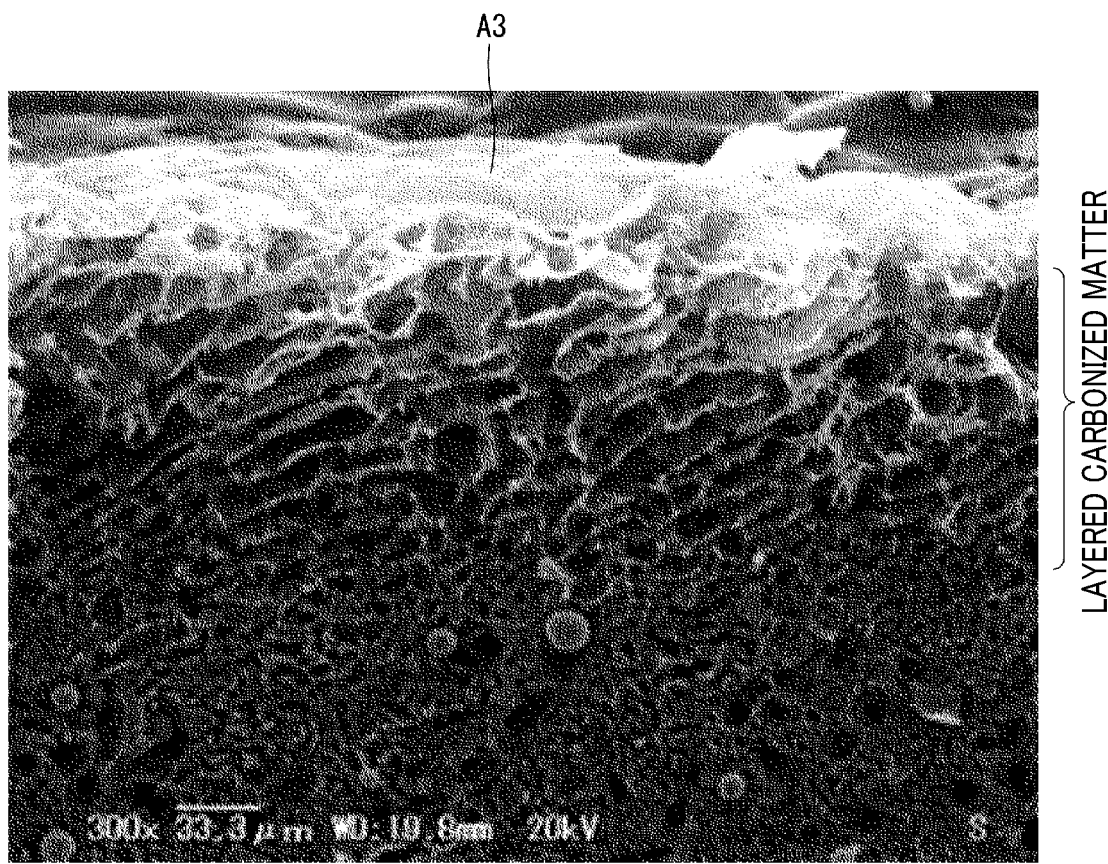
FIG. 44 is a photograph showing a carbonized layer, as viewed from an angle of 45 degrees, in a third area of the carbonized portion formed in the alignment layer in the carbonization step in Example 1.

In parallel, the heat conduction from the hot first area A1 increased in temperature and the hot gas due to decomposition generated from the first area A1 form, around the first area A1, a second area A2 that increases in temperature to about 1,800° C. to 2,200° C. and becomes carbonized. The second area A2 is off the laser beam scanning direction and not directly irradiated with the laser beam. However, a site carbonized under the influence of the temperature of the gas due to decomposition (hereinafter, a third area A3) is not easily evaporated or removed, and has a raised structure due to foaming and volume expansion (see FIG. 43). The third area A3 yet to be carbonized includes aligned filler. Based on the alignment state, a carbonized structure was formed as at least ten or more layers elongated in the surface direction (see FIG. 44).

Figure 45:
FIG. 45 is a photograph showing the cross section of the third-area carbonized matter cut along the laser beam direction with the entire resin member, after the carbonization step, fixed with a casting made from epoxy resin in Example 1.

As shown in FIG. 45, a first layer 21, a second layer 22, and a third layer 23 are observed, with the first layer 21 formed from a resin material containing the aligned filler 13, the second layer 22 foamed and overlying the first layer 21, and the third layer 23 overlying the second layer 22 and including carbonized matter layered as described above. Within 100 μm in the direction of the normal to the third layer 23, a carbonized layer is observed with a multilayer structure including at least ten or more layers. Under the first area A1 and the third area A3, the foamed-resin second layer 22 is formed.

Although in FIG. 45, the filler 13 is aligned and the carbonized matter is formed in the same direction, the filler 13 may be strongly aligned in a particular main direction along the resin member surface, and the main direction may be any direction along the resin member surface. For example, the filler 13 may be aligned in a direction perpendicular to the paper of FIG. 45. The carbonized layer and the resin member surface form an angle depending on the site carbonized and raised earlier in accordance with the laser beam scanning direction, and the layer is formed obliquely at some angle with a position upstream in the laser scanning direction being higher (apart from the surface).

In Example 1, the first area A1 and the third area A3 formed an electrically conductive pattern as a straight line with a width of 0.9 mm and a length of 40 mm, and the depth of the carbonization from the resin member surface in the thickness direction was 0.12 mm. Commercially available silver paste was applied to both ends of the electrically conductive pattern and cured, and the electrical resistance value of a 20-mm central part was measured. The electrical resistance value across the part was 97.1Ω.

The electrically conductive pattern formed in the first area A1 and the third area A3 was covered and fixed with a casting made from epoxy resin, and it was confirmed that the electrical resistance of the entire pattern did not vary. Then, the carbonized matter formed in the first area A1 was selectively removed from the entire pattern by cross section polishing to give a sample. Based on the relationship between electrical resistances, lengths, and cross-sectional shapes, the electrical conductivity of the carbonized matter formed in the first area A1 was compared with the electrical conductivity of the carbonized matter formed in the third area A3. The electrical conductivity of the carbonized matter formed in the first area A1 was three or more times as high as the electrical conductivity of the carbonized matter formed in the third area A3.

Furthermore, the third area A3 was examined by Raman spectroscopic analysis, and peaks were observed at 1580 cm$^{-1}$ (G band) and 1360 cm$^{-1}$ (D band). The peak intensity ratio of the G band to the D band (I1580/I1360) was 1.61.

The produced carbonized matter was oxidized by letting it stand at room temperature for five minutes in nitric acid with a 60% concentration. Then, the nitric acid was washed off with distilled water before the product was dried sufficiently in a thermostatic oven at 50° C. After that, when a measurement was conducted in the same manner, the electrical resistance decreased by 30%.

Example 2

In Example 2, a molded article was formed in the same manner as in Example 1 using an insulating resin material formed from a base polymer containing polyphenylene sulfide as a main component without filler and having a volume resistivity of $10^{13}$ Ωm or more. The molded article was carbonized by the same method as in Example 1. In this case, the carbonized matter was scattered violently and failed to fix. Then, the electrical resistance was measured by the same method as in Example 1, and the measurement result showed that the value was at least 50 MΩ or more. Furthermore, the electrical resistance was measured at varying laser beam outputs of 5 W, 10 W, 50 W, 100 W, 150 W, and 200 W. At each output, the electrical resistance value was at least 50 MΩ or more.

Example 3

A molded article was formed in the same manner as in Example 1 using an electrically conductive resin material having a volume resistivity of about 10 Ωm with about 30 wt % carbon fiber added as filler to a base polymer containing polyphenylene sulfide as a main component. The molded article was carbonized by the same method as in Example 1 to form the same electrically conductive pattern as in Example 1. The electrical resistance was measured by the same method as in Example 1, and the measurement result showed that the value was 21.8Ω. In addition, the volume resistivity of the electrically conductive pattern in this state was roughly calculated at $8.4 \times 10^{-5}$ Ωm based on the length, the cross-sectional shape, and the electrical resistance value.

Example 4

Figure 46:
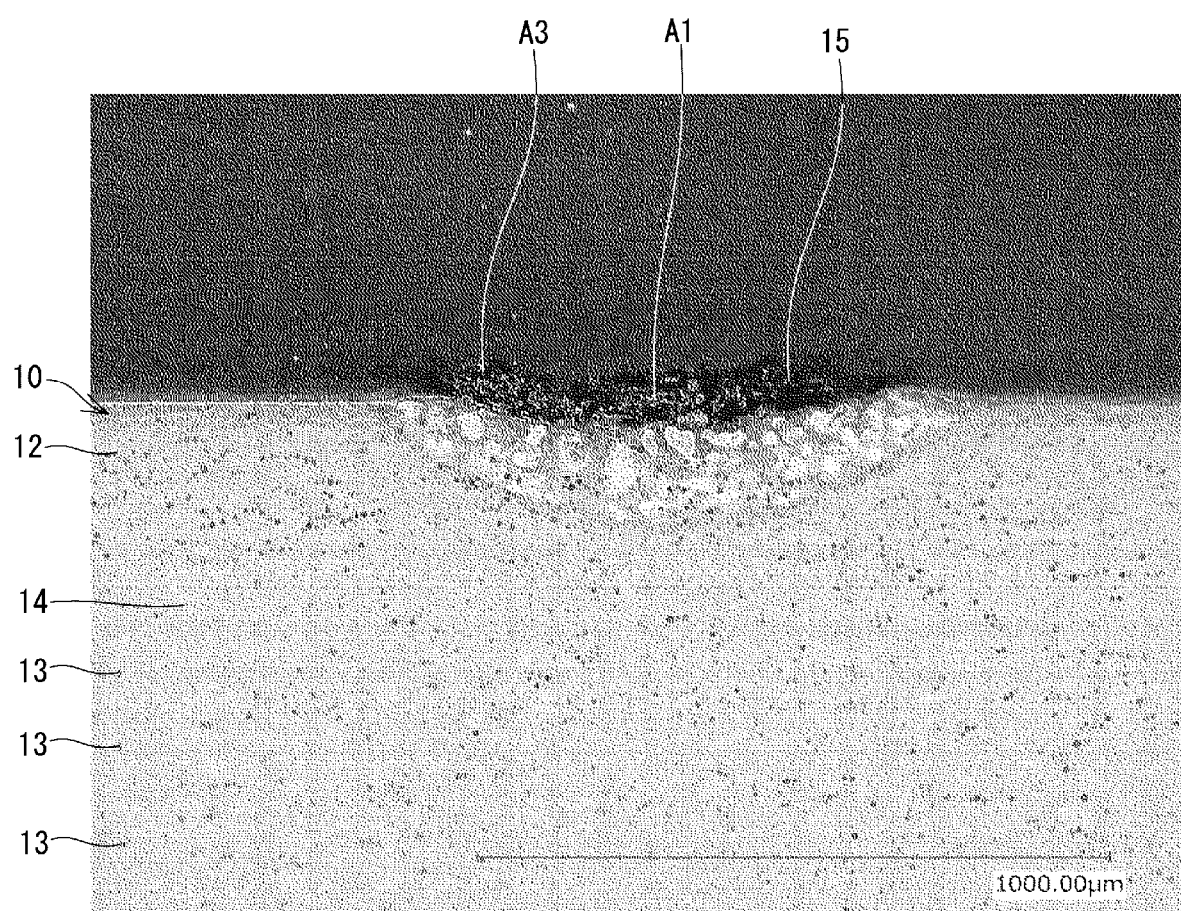
FIG. 46 is a photograph showing the edge of a carbonized portion formed in an alignment layer in a carbonization step in Example 4.

Carbonized matter was formed in the same manner as in Example 1 except that the atmospheric pressure in the laser beam irradiation was reduced to 0.001 MPa. The temperature of generated gas due to decomposition fell instantly, and little third area A3 was formed, with no layered carbonized layer formed in the third area A3 (see FIG. 46). The wiring pattern thus produced had a shape of a straight line with a width of 0.6 mm and a length of 40 mm, and the depth of the carbonization from the resin member surface in the thickness direction was 0.05 mm. Commercially available silver paste was applied to both ends of the electrically conductive pattern and cured, and the electrical resistance value of a 20-mm central part was measured. The electrical resistance value across the part was 1,124Ω.

Example 5

Figure 47:
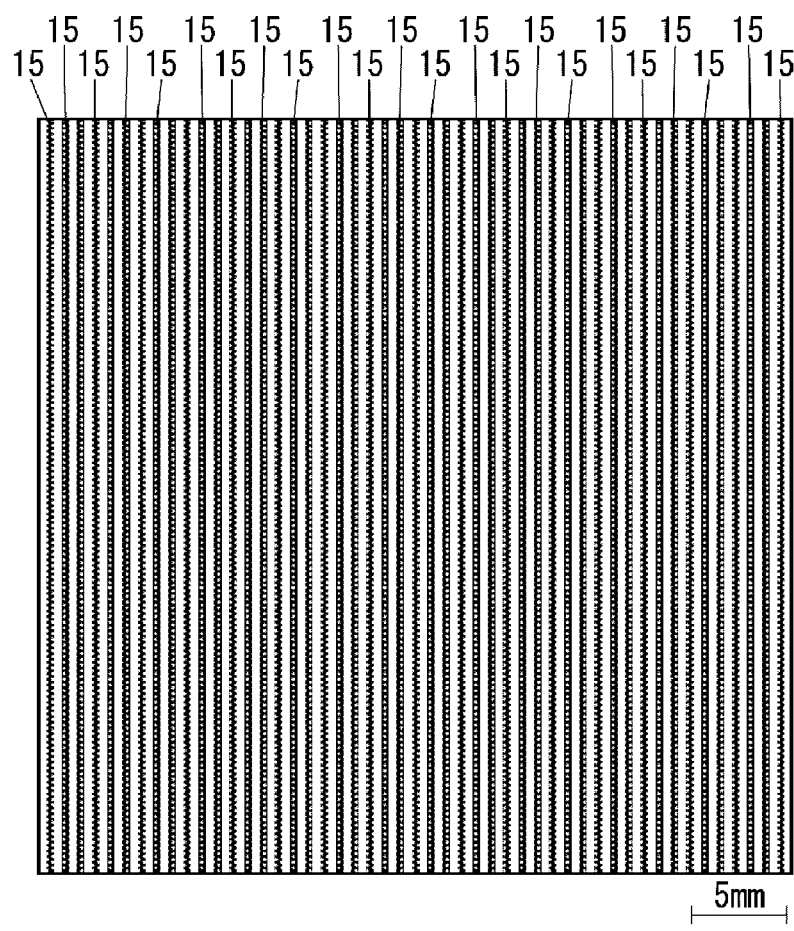
FIG. 47 is a diagram illustrating carbonized portions formed in an alignment layer in a carbonization step in Example 5.

As shown in FIG. 47, a carbonized portion was formed as a straight line with a length of 40 mm in the same manner as in Example 1, and the carbonized portion was formed 50 times with the laser beam scanning direction shifted each time at intervals of 0.8 mm in the direction vertical to the surface. As a result, the carbonized portions were electrically connected linearly to form an electrically conductive pattern that was 40 mm square. The carbonized matter thus produced and the carbonized matter formed in Example 1 had substantially the same electrical conductivity. In this example, irregularities similar to those in Example 1 were formed in the surface.

Example 6

A molded article was formed in the same manner as in Example 1 using an insulating resin material having a volume resistivity of $10^{13}$ Ωm or more with 33 wt % glass fiber and 33 wt % calcium carbide added as filler, which totaled 66 wt %, to a base polymer containing polyphenylene sulfide as a main component. The molded article was carbonized by the same method as in Example 1, and the same wiring pattern as in Example 1 was formed. The electrical resistance was measured by the same method as in Example 1, and the measurement result showed that the value was 1,270Ω.

Example 7

A molded article was formed in the same manner as in Example 1 using an insulating resin material having a volume resistivity of $10^{13}$ Ωm or more with 30 wt % glass fiber added as filler to a base polymer containing polyphenylene sulfide as a main component. The molded article was carbonized by the same method as in Example 1, and the same wiring pattern as in Example 1 was formed. The electrical resistance was measured by the same method as in Example 1, and the measurement result showed that the value was 139.3Ω.

Example 8

A molded article was formed in the same manner as in Example 1 using an insulating resin material having a volume resistivity of $10^{13}$ Ωm or more with 45 wt % glass fiber added as filler to a base polymer containing polyphenylene sulfide as a main component. The molded article was carbonized by the same method as in Example 1, and the same wiring pattern as in Example 1 was formed. The electrical resistance was measured by the same method as in Example 1, and the measurement result showed that the value was 169.1Ω.

Example 9

A molded article was produced by compression molding using an insulating resin material having a volume resistivity of $10^{13}$ Ωm or more with 35 wt % glass fiber and 15 wt % other inorganic filler as filler, which totaled 50 wt %, to a base polymer containing phenol resin as a main component. Then, the molded article was carbonized by the same method as in Example 1 to form a pattern with a width of 0.75 mm and a length of 40 mm, and the depth of the carbonization from the resin member surface in the thickness direction was 0.05 mm. In this state, the electrical resistance value of a 20-mm part was measured in the same manner as in Example 1. The electrical resistance value was 171.2Ω.

Example 10

A molded article was produced by injection molding using the same resin material as in Example 9. Then, the molded article was carbonized by the same method as in Example 1 to form the same electrically conductive pattern as in Example 9. In this state, the electrical resistance value of a 20-mm part was measured in the same manner as in Example 1. The electrical resistance value was 133.3Ω.

Example 11

A carbonized matter was formed in the same manner as in Example 1 except that the atmospheric pressure in the laser beam irradiation was increased to 1.0 MPa. The electrically conductive pattern formed had an electrical conductivity improved by 30% compared with Example 1.

Example 12

The molded article formed in the same manner as in Example 1 was subjected to 1.5-mm wet abrasion on the surface in the thickness direction to remove the alignment layer. Then, on the resin member surface, after being dried sufficiently, carbonized matter was formed in the same manner as in Example 11, and the same electrically conductive pattern as in Example 1 was formed. In this state, the electrical resistance value of a 20-mm part was measured in the same manner as in Example 1. The electrical resistance value was 558Ω.

Example 13

Figure 48:
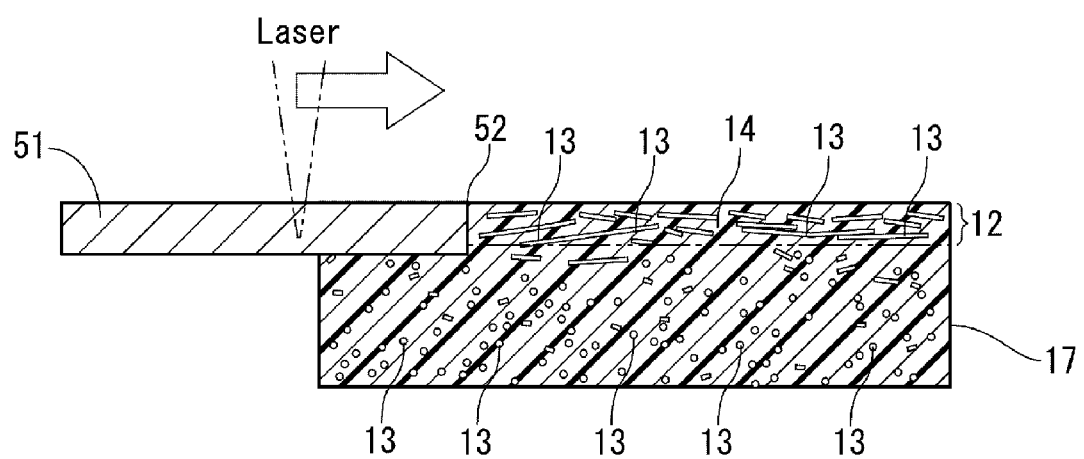
FIG. 48 is a cross-sectional view of the alignment layer of a molded article and a metallic member with their contact interface being irradiated with a laser beam in a carbonization step of a production method in Example 13.
Figure 49:
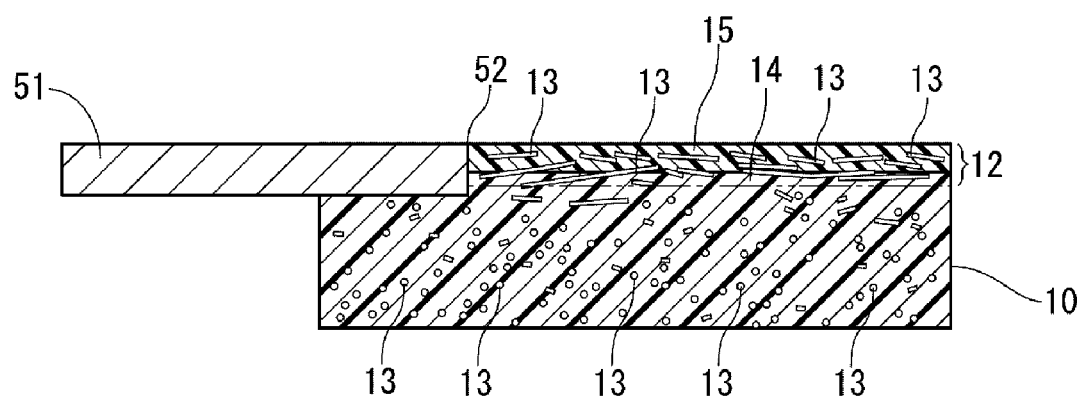
FIG. 49 is a cross-sectional view of the alignment layer and the metallic member with their contact interface carbonized in Example 13.

As shown in FIG. 48, the alignment layer 12 of a molded article 17 formed in the same manner as in Example 1 was brought into close contact with a metallic member 51 such as iron, copper, or brass. Under the same conditions as in Example 1, a laser beam was applied to a contact interface 52 between the alignment layer 12 and the metallic member 51 to form a carbonized portion 15 as shown in FIG. 49. The carbonized portion 15 and the metallic member 51 were electrically connected to each other sufficiently.

Example 14

Figure 50:
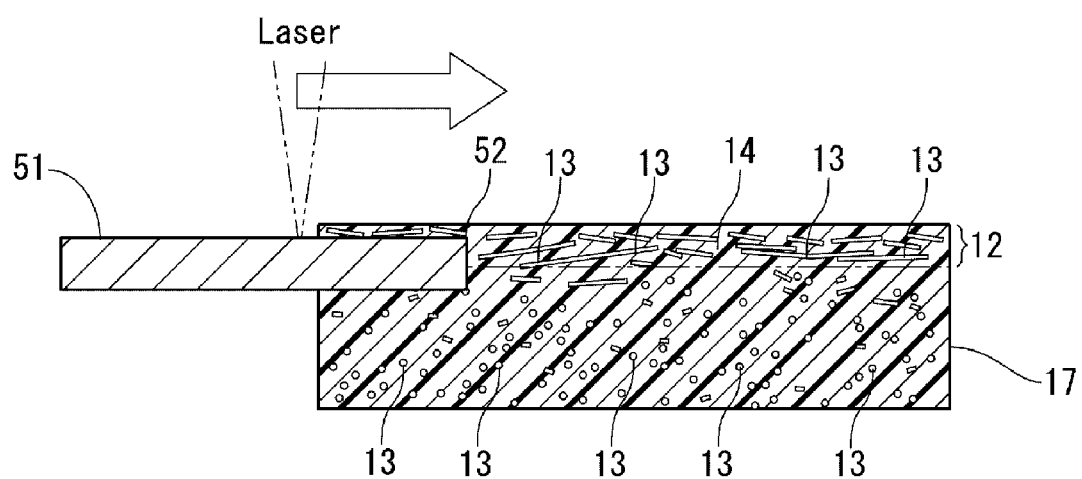
FIG. 50 is a cross-sectional view of the alignment layer of a molded article and a metallic member with their contact interface being irradiated with a laser beam in a carbonization step of a production method in Example 14.
Figure 51:
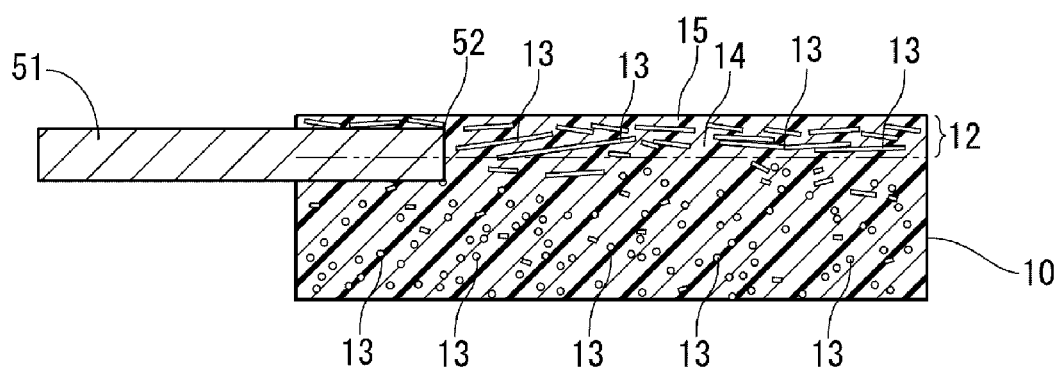
FIG. 51 is a cross-sectional view of the alignment layer and the metallic member with their contact interface carbonized in Example 14.

As shown in FIG. 50, a molded article 17 was formed from the same resin material as in Example 1 with a predetermined area thinned to about 0.1 mm, and the thin area was brought into close contact with a metallic member 51. Under the same conditions as in Example 1, a laser beam was applied to the metallic member 51 and the thin area of the molded article 17 in the thickness direction to form the carbonized portion 15 as shown in FIG. 51. The carbonized portion 15 corresponding to the thin area reached the metallic member 51 in the thickness direction, and the carbonized portion 15 and the metallic member 51 were electrically connected to each other sufficiently.

When a carbonized portion is formed in the contact interface between the alignment layer of a molded article and a metallic member, the resin of the alignment layer may not be heated for carbonization, but the metallic member may be heated to serve as a heat source for carbonizing the alignment layer.

Although the metallic member used in the above method is not limited to a particular material, the selection of a metal that easily solid-solubilizes carbon, such as nickel, bismuth, or iron, leads to particularly good bonding and electrical connection. In particular, the use of nickel is particularly effective because catalysis occurs in the interface to form high-quality graphite. In some cases, iron is also effective since it reacts with carbon to form an electrically conductive compound depending on the temperature and the amount of carbon supplied. Such a kind of metal may be added to the surface of the metallic member by plating or other method.

Example 15

When the carbonized matter formed in Examples 1 to 14 was covered with an epoxy resin casting, the electrical conductivity of the carbonized matter did not change, and a resin member with an internal pattern having good electrical conductivity was obtained.

Other Embodiments

In another embodiment, the carbonized portion may not be a pattern, but may be formed as a film. In this case, the resin member may have, on its surface, an electrically conductive film denser than a resin member provided with electrical conductivity by mixing and dispersing electrically conductive filler in a resin material. This enables the resin member to have better electromagnetic shielding. A thick resin member that is 300 μm or more in thickness may have higher electrical conductivity and thermal conductivity as well as better electromagnetic shielding.

In another embodiment, the carbonized portion may not be provided apart from the core layer. More specifically, the carbonized portion may reach the core layer through the skin layer. In the core layer, the filler tends to be aligned irregularly. However, at least pieces of the filler may penetrate the carbonized portion to prevent the carbonized portion from being detach from the base portion.

In another embodiment, the entire outer surface of the resin member may be provided with a planar carbonized portion. Moreover, the carbonized portion may reach the core layer through the skin layer. In this case, the base portion is composed of the core layer.

In another embodiment, the amount of filler added and the heating conditions may be modified to adjust the electrical resistance value, and the product may be used as a resistor or a heater in an electrical device.

In other embodiment, to further enhance electrical conductivity and thermal conductivity, the carbonized matter formed in the surface of a resin member may be used as an electrode and electroplated. Furthermore, to enhance electrical conductivity, an oxidizing agent may be used to cause oxidation.

In another embodiment, to form a complex electrically conductive pattern, every surface of a molded article may be provided with an electrically conductive pattern. For example, with a through hole made in the molded article, the electrically conductive patterns formed on both sides of the through hole may be electrically connected by carbonizing the inside of the through hole or inserting an electrically conductive member.

Figure 52:
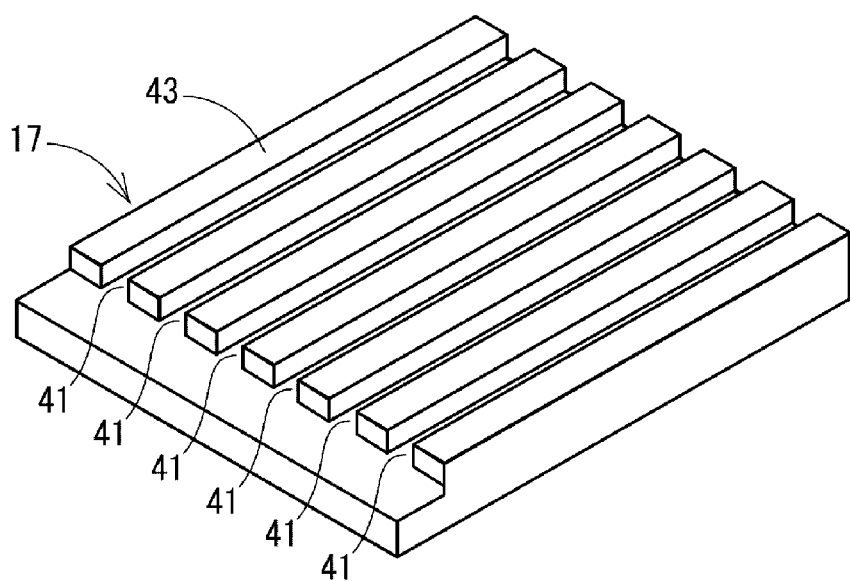
FIG. 52 is a perspective view of a molded article formed in another embodiment.
Figure 53:
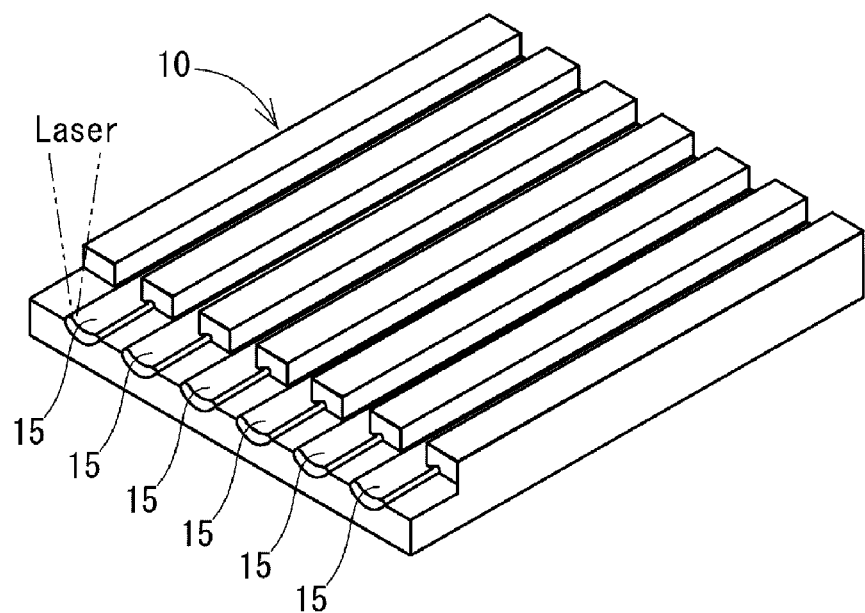
FIG. 53 is a perspective view of the molded article with a carbonized portion formed in the other embodiment.
Figure 54:
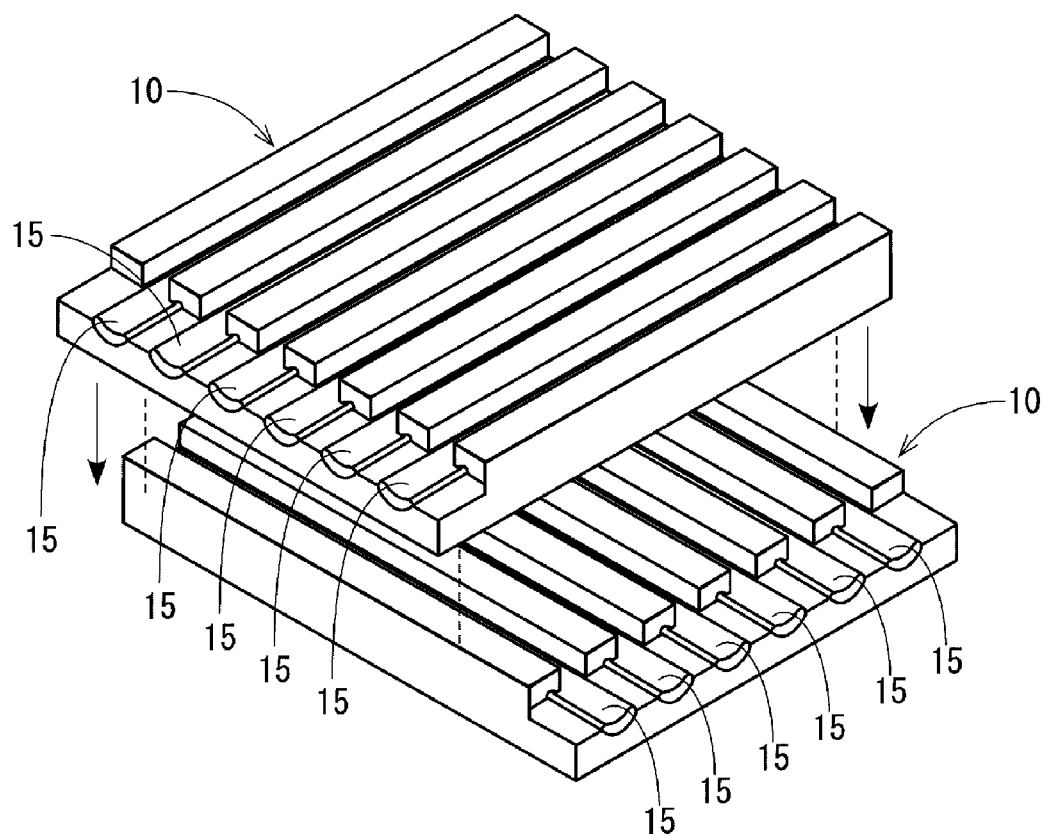
FIG. 54 is a perspective view of a plurality of resin members being combined with each other in the other embodiment.
Figure 55:
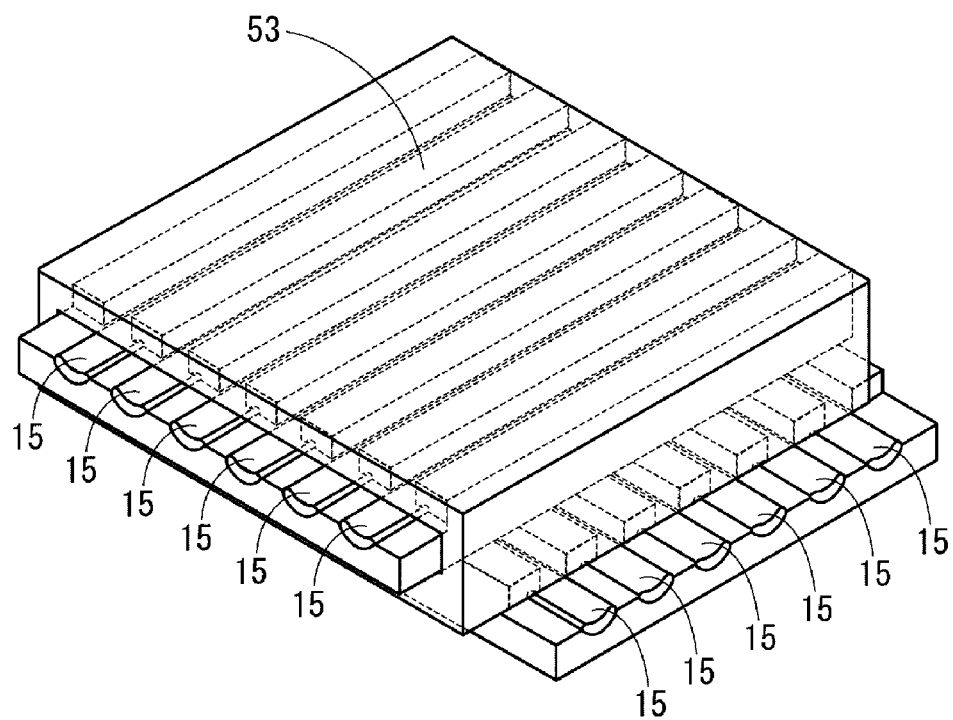
FIG. 55 is a perspective view of the plurality of resin members with a covering formed in the other embodiment.

In another embodiment, to form more complex multilevel crossing, resin members 10 may be each produced by providing carbonized portions 15 in predetermined positions as shown in FIG. 53 in a molded article 17 formed as shown in FIG. 52, and the plurality of resin members 10 may be integrated as shown in FIG. 54 by, for example, fitting such as press fitting or snap fitting, bonding, welding, or insert molding. Furthermore, to prevent the carbonized matter from coming off, a covering 53 that covers and secures the carbonized matter may be formed as shown in FIG. 55 by, for example, insert molding, potting, applying a curing agent, covering, or other method. In this state, some pieces of the filler have penetrated the carbonized matter and protrude from the resin members 10. Thus, when the protruding pieces of the filler penetrate the covering 53, which is a secondary molded article, the resin members 10 and the covering 53 have higher adhesion.

In another embodiment, to prevent the carbonized matter from coming off, a part of the resin forming the molded article may be molten by heating to encase the carbonized matter. The heat source for the heating may be a laser beam.

Figure 56:
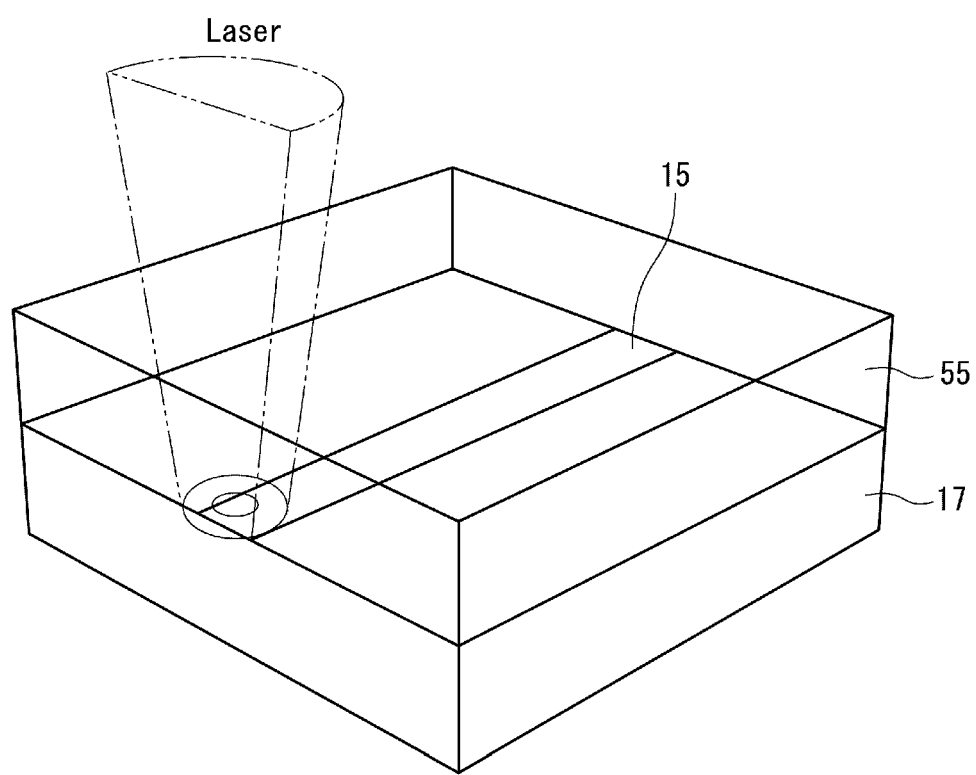
FIG. 56 is a perspective view of a molded article being irradiated with a laser beam through a transmissive material in another embodiment.

In another embodiment, a layer of a material that transmits a laser beam (transmissive material) may be formed on the surface of a molded article 17 before carbonization. As shown in FIG. 56, a laser beam may be applied to a molded article 17 through a transmissive material 55 to form a carbonized portion 15 between the molded article 17 and the transmissive material 55. It is desirable to provide a channel between the molded article 17 and the transmissive material 55 for release of gas due to decomposition by, for example, providing a porous layer between the molded article 17 and the transmissive material 55 or forming irregularities on the surface of the molded article 17 or the transmissive material 55.

Although carbonized matter and another metallic member may be simply brought into contact with each other to establish electrical connection between them, in another embodiment, electrically conductive adhesive such as silver paste or carbon paste or molten metal such as solder may be applied between the carbonized matter and the metallic member.

In another embodiment, the laser used in the carbonization step may also be used to debur the resin member or perform printing on it.

The present disclosure has been described based on the embodiments. However, this disclosure is not limited to the embodiments and configurations. The disclosure encompasses various modifications and alterations falling within the range of equivalence. Additionally, various combinations and forms as well as other combinations and forms with one, more than one, or less than one element added thereto also fall within the scope and spirit of the present disclosure.

What is claimed is:

1. A resin member including a resin material, the resin member comprising:
   a base portion including an insulating base polymer formed from the resin material, and filler, the filler comprising a fibrous material and being stronger than the base polymer, and the base portion being reinforced by the filler mixed in the base polymer; and
   a carbonized portion provided in an outer surface of the base portion and having electrical conductivity due to carbonized substances included therein,
   wherein
   the filler prevents the carbonized portion from being detach from the base portion, with at least pieces of the filler penetrating the carbonized portion.

2. The resin member according to claim 1, further comprising:
- a skin layer extending along the outer surface of the base portion; and
- a core layer provided inside the skin layer, wherein
of the skin layer and the core layer, at least the core layer forms the base portion,
the outer surface of the base portion has a recessed surface being recessed toward the core layer, and
the carbonized portion is provided on the recess in a manner to extend from the skin layer toward the core layer.

3. The resin member according to claim 2, wherein the carbonized portion is provided apart from the core layer in the skin layer.

4. The resin member according to claim 2, wherein the carbonized portion extends in a direction crossing the filler extending in the skin layer along the outer surface of the base portion.

5. The resin member according to claim 1, wherein the outer surface of the base portion has first outer surfaces, a second outer surface extending in a direction crossing the first outer surfaces, and rounded outer surfaces obtained by rounding parts where the first outer surfaces and the second outer surface meet, and
the carbonized portion includes first carbonized portions provided in the first outer surfaces, a second carbonized portion provided in the second surface, and connection carbonized portions provided in the rounded outer surfaces and connecting the first carbonized portions and the second carbonized portion.

6. The resin member according to claim 1, wherein the outer surface of the base portion has a deformation obtained by deforming at least a part of the base portion, the deformation extending along peripheral edges of the carbonized portion.

7. The resin member according to claim 6, wherein the deformation includes at least one of a foamed portion in which at least a part of the base portion is foamed, and a plurality of recesses provided in the outer surface of the base portion.

8. A method for producing the resin member of claim 1 including the resin material, the method comprising:
- a preparation step of preparing the base portion including the insulating base polymer formed from the resin material, and filler, the filler comprising the fibrous material and being stronger than the base polymer, and the base portion being reinforced by the filler mixed in the base polymer; and
- a carbonization step of heating the base portion to provide the carbonized portion in the outer surface of the base portion, the carbonized portion having electrical conductivity due to included carbonized substances obtained by carbonizing a part of the base polymer such that at least pieces of the filler penetrate the carbonized portion to prevent the carbonized portion from being detached from the base portion.

9. The method according to claim 8, wherein:
the preparation step includes preparing the base portion including a skin layer extending along the outer surface of the base portion, and a core layer provided inside the skin layer, and
the carbonization step includes heating the skin layer to carbonize at least a part of the skin layer into the carbonized portion.

10. The method according to claim 9, wherein the carbonization step includes heating the skin layer to form the carbonized portion not being in contact with the core layer.

11. The method according to claim 9, wherein the carbonization step includes heating the skin layer to extend the carbonized portion in a direction crossing the filler extending in the skin layer along the outer surface of the base portion.

12. The method according to claim 8, further comprising:
a rounding step of forming rounded surfaces in the base portion including, on the outer surface, first surfaces and a second surface extending in a direction crossing the first surfaces, the rounded surfaces being obtained by rounding parts where the first surfaces and the second surface meet, wherein
the carbonization step includes heating the base portion to provide the outer surface of the base portion with, as the carbonized portion, first carbonized portions extending along the first surfaces, a second carbonized portion extending along the second surface, and connection carbonized portions extending along the rounded surfaces and connecting the first carbonized portions and the second carbonized portion.

13. The method according to claim 12, wherein the carbonization step includes heating the base portion continuously from one of each first surface and the second surface to the other via the rounded surface to connect the first carbonized portion and the second carbonized portion via the connection carbonized portion.

14. The method according to claim 8, further comprising after the carbonization step, a deformation step of deforming at least a part of the base portion to extend a deformation obtained by deforming at least a part of the base portion, along peripheral edges of the carbonized portion in the outer surface of the base portion.

15. The method according to claim 14, wherein the deformation step includes heating at least a part of each of the base portion and the carbonized portion at a temperature lower than a temperature in the heating of the base portion in the carbonization step, to provide the deformation in the outer surface of the base portion.

16. The method according to claim 14, wherein the carbonization step includes heating the base portion by applying an electromagnetic wave to the base portion to form the carbonized portion, and
the deformation step includes heating the base portion is heated to provide the deformation by irradiating the base portion with the electromagnetic wave at an intensity lower than an intensity of the electromagnetic wave applied to the base portion during carbonization.

\* \* \* \* \*